US012568613B2

(12) United States Patent

Chuang

(10) Patent No.: US 12,568,613 B2

(45) Date of Patent: Mar. 3, 2026

(54) METHOD OF MANUFACTURING SEMICONDUCTOR DEVICE

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 346 days.

(21) Appl. No.: 18/367,059

(22) Filed: Sep. 12, 2023

(65) Prior Publication Data

US 2024/0147691 A1 May 2, 2024

Related U.S. Application Data

(62) Division of application No. 17/978,320, filed on Nov. 1, 2022, now Pat. No. 12,396,151.

(51) Int. Cl.
*H10B 12/00* (2023.01)

(52) U.S. Cl.
CPC ........... *H10B 12/05* (2023.02); *H10B 12/488* (2023.02)

(58) Field of Classification Search
CPC ........ H10B 12/00; H10B 12/02; H10B 12/03; H10B 12/05; H10B 12/488; H10B 12/50;
(Continued)

(56) References Cited

U.S. PATENT DOCUMENTS 6,424,001 B1 * 7/2002 Forbes ................... H10D 30/63
257/353
9,502,432 B1 11/2016 Shin
(Continued)

FOREIGN PATENT DOCUMENTS

CN 106169476 A 11/2016
CN 111403416 A 7/2020
(Continued)

OTHER PUBLICATIONS

Office Action and and the search report mailed on Dec. 18, 2023 related to Taiwanese Application No. 112115321.
(Continued)

*Primary Examiner* — Britt Hanley
*Assistant Examiner* — Kevin Quinto
(74) *Attorney, Agent, or Firm* — Xuan Zhang

(57) ABSTRACT

A method of manufacturing a semiconductor device is provided. The method includes: providing a substrate; forming a metallization layer on the substrate; forming a first sacrificial layer and a second sacrificial layer; forming a first mask layer and a second mask layer, wherein the first mask layer covers the first sacrificial layer, the second mask layer covers the second sacrificial layer; forming a first width controlling element on a lateral surface of the first mask layer and a second width controlling element on a lateral surface of the second mask layer; removing the first mask layer and the second mask layer; and patterning the metallization layer to form a first word line between the first sacrificial layer and the second sacrificial layer, wherein a dimension of the first word line depends on a dimension of the first width controlling element.

6 Claims, 37 Drawing Sheets

(58) Field of Classification Search
CPC ........... H10D 30/6728; H10D 30/6729; H10D
30/673
See application file for complete search history.

(56) References Cited

U.S. PATENT DOCUMENTS

| | | |
|---|---|---|
| 2022/0165738 A1 | 5/2022 | Zhang et al. |
| 2022/0320302 A1 | 10/2022 | Yu |

FOREIGN PATENT DOCUMENTS

| | | | |
|---|---|---|---|
| CN | 112447521 | A | 3/2021 |
| CN | 113675206 | A | 11/2021 |
| EP | 4068345 | A1 | 10/2022 |
| TW | 200739884 | A | 10/2007 |
| TW | 200824048 | A | 6/2008 |
| TW | 201019463 | A | 5/2010 |
| TW | 202018944 | A | 5/2020 |
| TW | 202018944 | A1 | 5/2020 |
| TW | 202238578 | A | 10/2022 |
| WO | WO2013180757 | A1 | 12/2013 |

OTHER PUBLICATIONS

Office Action and and the search report mailed on Jul. 29, 2024 related to Taiwanese Application No. 113100567.

\* cited by examiner

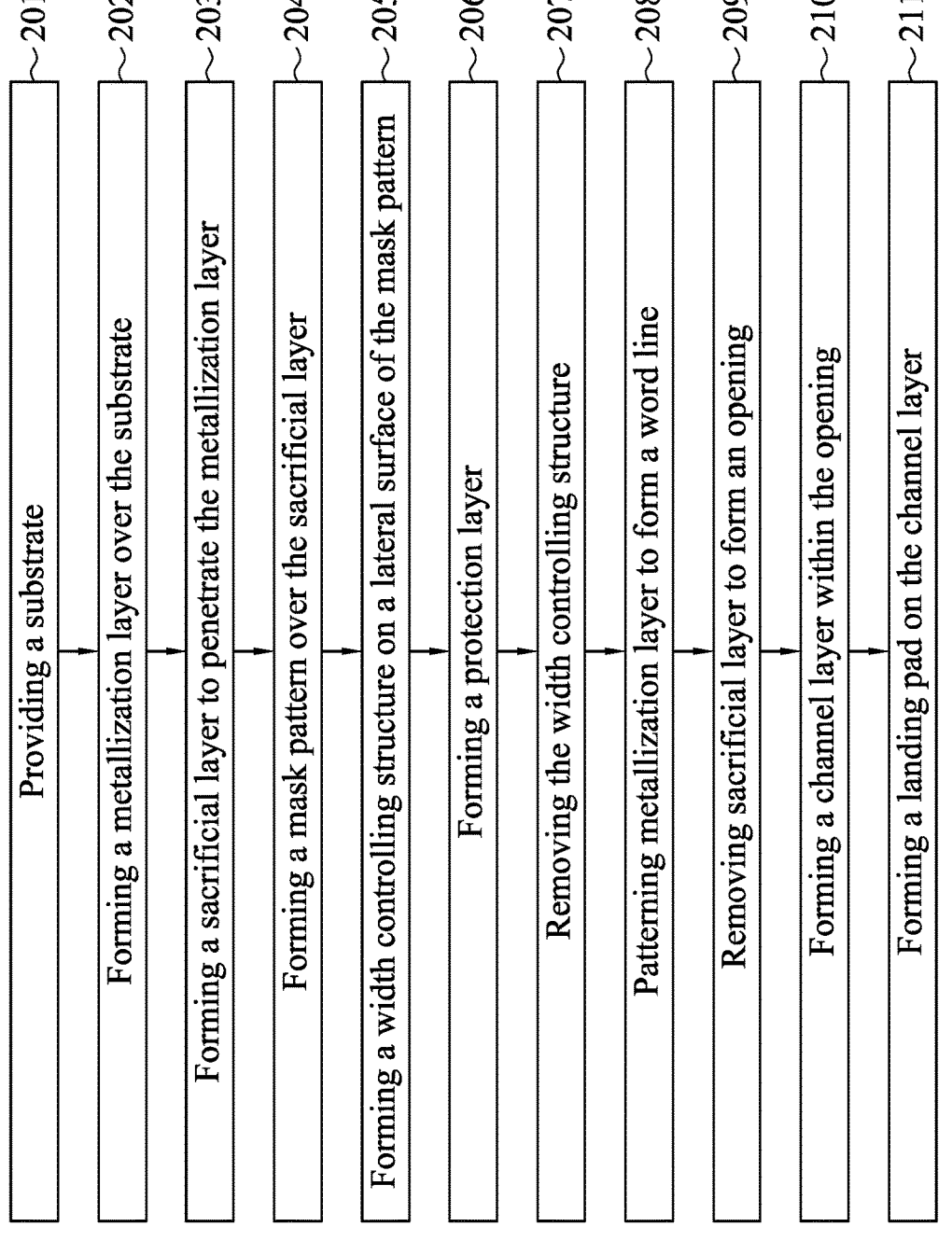

200

201 — Providing a substrate

202 — Forming a metallization layer over the substrate

203 — Forming a sacrificial layer to penetrate the metallization layer

204 — Forming a mask pattern over the sacrificial layer

205 — Forming a width controlling structure on a lateral surface of the mask pattern 206 — Forming a protection layer 207 — Removing the width controlling structure 208 — Patterning metallization layer to form a word line 209 — Removing sacrificial layer to form an opening 210 — Forming a channel layer within the opening 211 — Forming a landing pad on the channel layer

FIG. 2

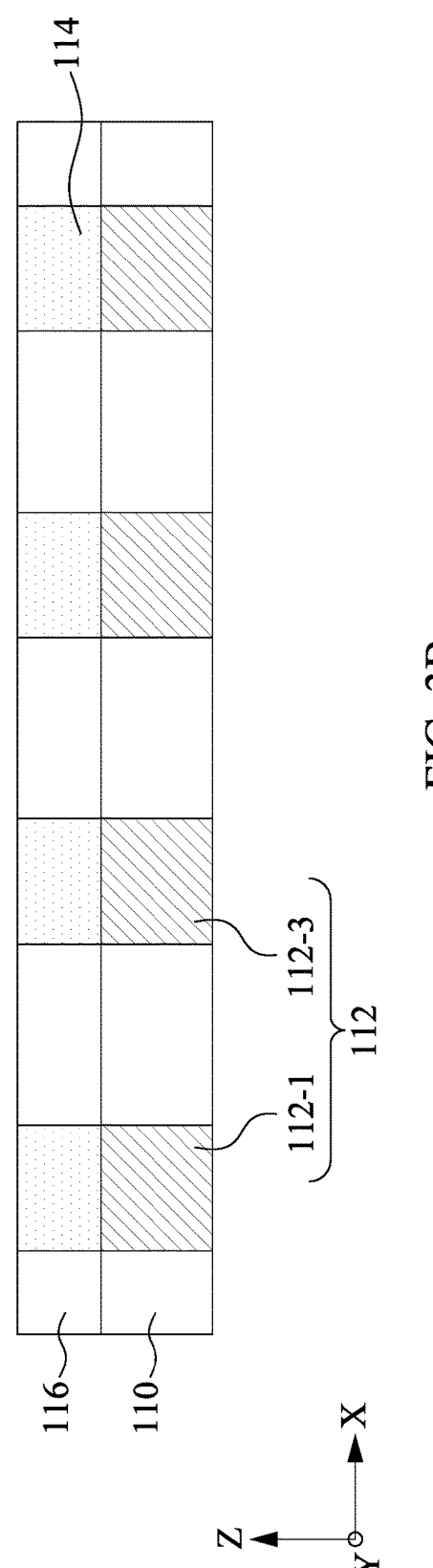
FIG. 3B

METHOD OF MANUFACTURING SEMICONDUCTOR DEVICE

CROSS-REFERENCE TO RELATED APPLICATION

This application is a divisional application of U.S. Non-Provisional application Ser. No. 17/978,320 filed Nov. 1, 2022, which is incorporated herein by reference in its entirety.

TECHNICAL FIELD

The present disclosure relates to a method of manufacturing a semiconductor device, and in particularly to a method using a width controlling structure to determine the width of a word line.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, in which F represents the photolithographic minimum feature width or critical dimension (CD). However, recently, DRAM manufacturers are facing significant challenges in minimizing memory cell area as word line spacing continues to be reduced. For example, the channel of a bit line is prone to contact with a word line, thereby inducing electrical short due to an overlay error in lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device. The method includes: providing a substrate; forming a metallization layer on the substrate; forming a first sacrificial layer and a second sacrificial layer, each of which penetrates the metallization layer; forming a first mask layer and a second mask layer, wherein the first mask layer covers the first sacrificial layer, the second mask layer covers the second sacrificial layer; forming a first width controlling element on a lateral surface of the first mask layer and a second width controlling element on a lateral surface of the second mask layer; removing the first mask layer and the second mask layer; and patterning the metallization layer to form a first word line between the first sacrificial layer and the second sacrificial layer, wherein a dimension of the first word line depends on a dimension of the first width controlling element.

Another aspect of the present disclosure provides a method of manufacturing a semiconductor device. The method includes: providing a substrate; forming a metallization layer on the substrate; forming a first sacrificial layer, a second sacrificial layer, and a third sacrificial layer penetrating the metallization layer, wherein the first sacrificial layer is aligned to the third sacrificial layer along a first direction, and the second sacrificial layer is free from overlapping the first sacrificial layer and the third sacrificial layer along the first direction; forming a width controlling structure between the first sacrificial layer and the third sacrificial layer, wherein the width controlling structure exposes the first sacrificial layer, the second sacrificial layer, and the third sacrificial layer; forming a protective layer covering the first sacrificial layer, the second sacrificial layer, the third sacrificial layer; and removing the width controlling structure; and patterning the metallization layer to form a first word line surrounding the first sacrificial layer, a second word line surrounding the second sacrificial layer, and a third word line surrounding the third sacrificial layer.

Another aspect of the present disclosure provides a method for manufacturing a semiconductor device. The method includes: providing a substrate; forming a metallization layer on the substrate; forming a mask pattern on the metallization layer; forming a width controlling structure on a lateral surface of the mask pattern to define a gap exposing the metallization layer; removing the mask pattern; and patterning the metallization layer to form a word line, wherein a width of the word line is substantially equal to a width of the gap.

The embodiments of the present disclosure provide a method of manufacturing a semiconductor device. In this embodiment, the pattern of the word line may be determined by a width controlling structure. Further, the word line may be formed without using a photolithography process, which may cause overlay error and then result in electrical leakage between a channel layer and the word line. Further, the dimension (e.g., width) of the word line may be controlled accurately by determining the thickness of the width controlling structure. Thus, the performance of the semiconductor device may be improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 2 is a flowchart illustrating a method of manufacturing a semiconductor device, in accordance with some embodiments of the present disclosure.

FIG. 3B is a cross-section along line A-A' of FIG. 3A, in accordance with some embodiments of the present disclosure.

DETAILED DESCRIPTION

Figure 1A:
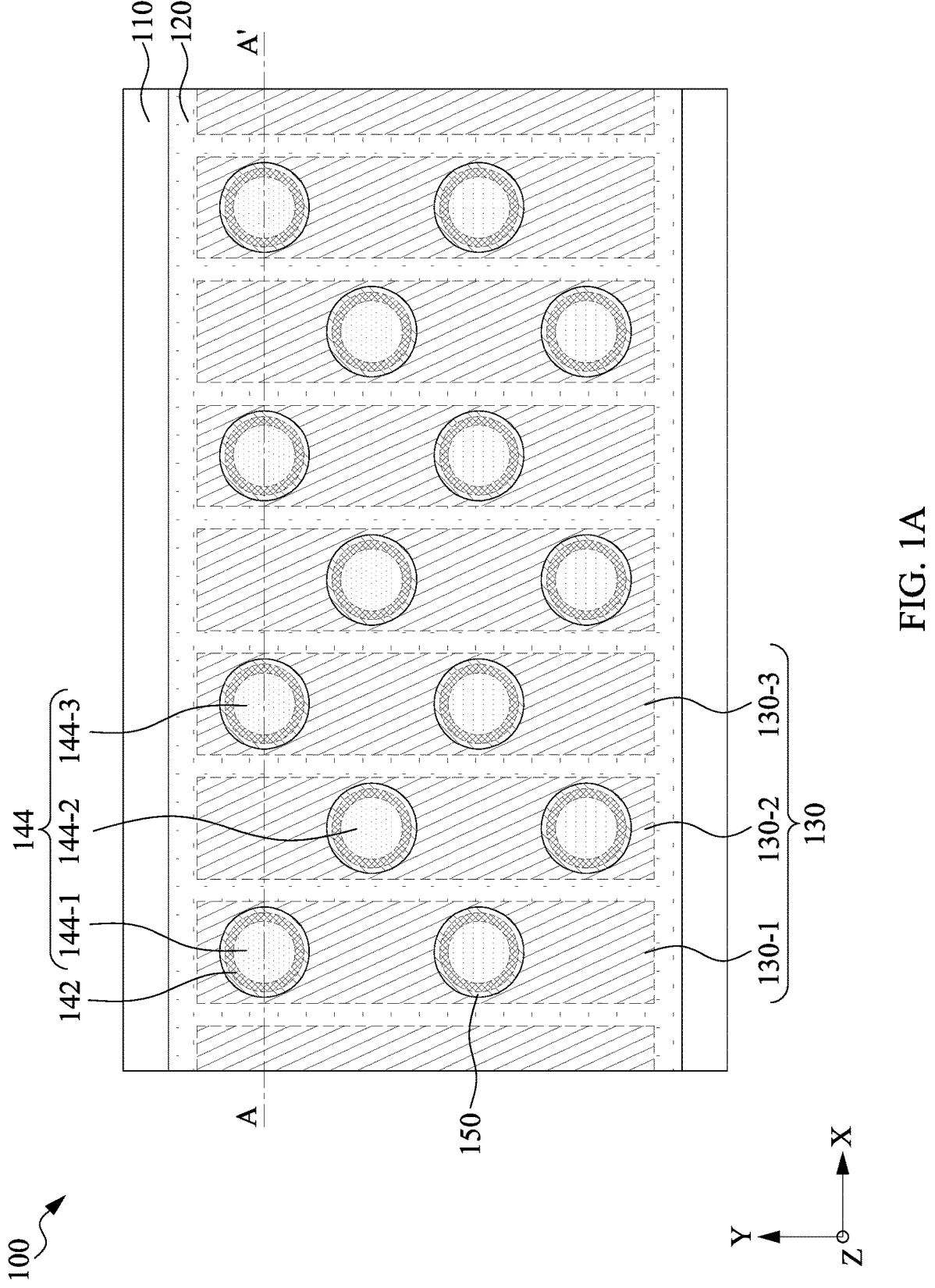
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a top view of a semiconductor device 100, in accordance with some embodiments of the present disclosure.

Figure 1B:
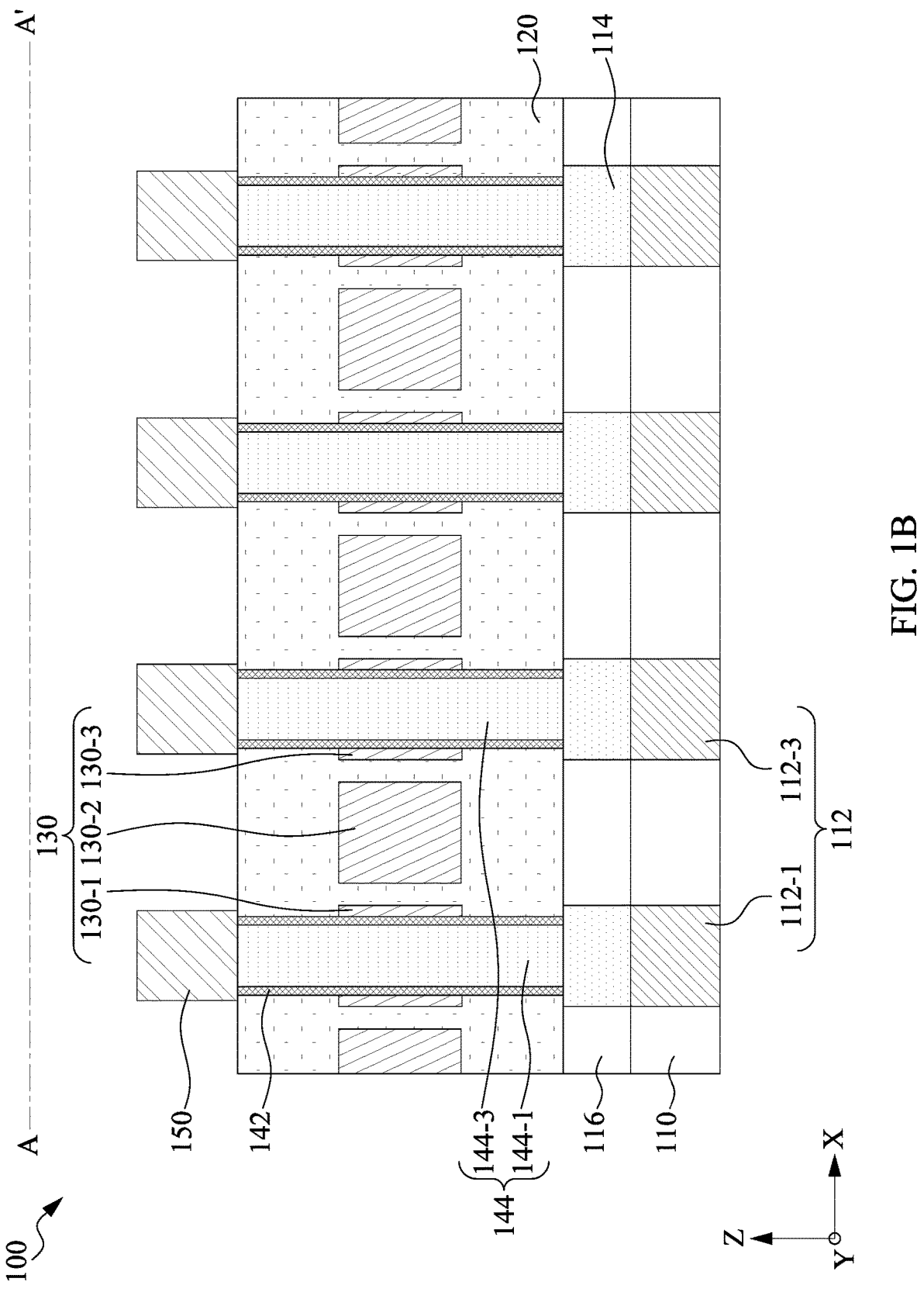
FIG. 1B is a cross-section along line A-A' of the semi-conductor device as shown in FIG. 1A, in accordance with some embodiments of the present disclosure.

In some embodiments, the semiconductor device 100 may include a cell region in which a memory device, such as the structure shown in FIG. 1A and FIG. 1B, is formed. The memory device may include, for example, a dynamic random access memory (DRAM) device, a one-time programming (OTP) memory device, a static random access memory (SRAM) device, or other suitable memory devices. In some embodiments, a DRAM may include, for example, a transistor, a capacitor, and other components. During a read operation, a word line may be asserted, turning on the transistor. The enabled transistor allows the voltage across the capacitor to be read by a detection amplifier through a bit line. During a write operation, the data to be written may be provided on the bit line when the word line is asserted.

In some embodiments, the semiconductor device 100 may include a peripheral region (not shown) utilized to form a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

As shown in FIG. 1A, the semiconductor device 100 may include a substrate 110, a dielectric structure 120, a plurality of word lines 130, a plurality of gate dielectric layers 142, a plurality of channel layers 144, and a plurality of landing pads 150.

The substrate 110 may be a semiconductor substrate, such as a bulk semiconductor, a semiconductor-on-insulator (SOI) substrate, or the like. The substrate 110 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 110 may have a multilayer structure, or the substrate 110 may include a multilayer compound semiconductor structure.

The substrate 110 may have multiple doped regions (not shown) therein. In some embodiments, p type and/or n type dopants may be doped in the substrate 110. In some embodiments, p type dopants include boron (B), other group III elements, or any combination thereof. In some embodiments, n type dopants include arsenic (As), phosphorus (P), other group V elements, or any combination thereof.

The dielectric structure 120 may be disposed on the substrate 110. In some embodiments, the dielectric structure 120 may include a multilayered structure. In some embodiments, the dielectric structure 120 may include silicon oxide ($SiO_x$), silicon nitride ($Si_xN_y$), silicon oxynitride (SiON), or other suitable materials.

Each of the word lines 130 (e.g., 130-1, 130-2, and 130-3) may extend along the Y-axis. Each of the word lines 130-1, 130-2, and 130-3 may be parallel. In some embodiments, each of the word lines 130-1, 130-2, and 130-3 may be physically separated by the dielectric structure 120. The word line 130 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, the gate dielectric layer 142 may be disposed on the substrate 110. In some embodiments, each of the gate dielectric layers 142 may be surrounded by a corresponding word line 130. In some embodiments, the gate dielectric layer 142 may have a ring shape or other suitable profiles. However, the present disclosure is not intended to be limiting. In some embodiments, the gate dielectric layer 142 may include silicon oxide ($SiO_x$), silicon nitride ($Si_xN_y$), silicon oxynitride (SiON), or a combination thereof. In some embodiments, the gate dielectric layer may include dielectric material(s), such as high-k dielectric material. The high-k dielectric material may have a dielectric constant (k value) exceeding 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the channel layers 144 (e.g., 144-1, 144-2, and 144-3) may be disposed on the substrate 110. In some embodiments, each of the channel layers 144-1, 144-2, and 144-3 may be surrounded by a corresponding gate dielectric layer 142. In some embodiments, the channel layer 144 may be surrounded by the word line 130. For example, the channel layer 144-1 may be surrounded by the word line 130-1. The channel layer 144-2 may be surrounded by the word line 130-2. The channel layer 144-3 may be surrounded by the word line 130-3. The channel layer 144-1 may be aligned with the channel layer 144-3 along the X-axis. The channel layer 144-2 may be misaligned with the channel layer 144-1 (or channel layer 144-3) along the X-axis. In some embodiments, the channel layer 144 may have a circular, elliptical, oval, or other suitable profiles. However, the present disclosure is not intended to be limiting.

The material of the channel layer 144 may include an amorphous semiconductor, a poly-semiconductor and/or metal oxide. The semiconductor may include, but is not limited to, germanium (Ge), silicon (Si), tin (Sn), antimony (Sb). The metal oxide may include, but is not limited to, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. However, the present disclosure is not intended to be limiting.

Each of the landing pads 150 may be disposed on the channel layer 144. Each of the landing pads 150 may be physically separated. In some embodiments, the landing pad 150 may be located at a horizontal level (or height) higher than that of the word line 130. The landing pad 150 may cover the channel layers 144-1, 144-2, and 144-3. In some embodiments, each of the landing pads 150 may be electrically connected to a bit line (not shown) over the landing pads 150. The landing pad 150 may include conductive materials, such as tungsten, copper, aluminum, tantalum, tantalum nitride, titanium, titanium nitride, the like, and/or a combination thereof. However, the present disclosure is not intended to be limiting.

FIG. 1B is a cross-section along line A-A' of the semiconductor device 100 as shown in FIG. 1A, in accordance with some embodiments of the present disclosure.

As shown in FIG. 1B, the semiconductor device 100 further includes capacitor structures 112 (e.g., 112-1 and 112-3). In some embodiments, the channel layer 144-1 may cover, or vertically overlap, the capacitor structure 112-1. In some embodiments, the channel layer 144-3 may cover, or vertically overlap, the capacitor structure 112-3. In some embodiments, each of the capacitor structures 112-1 and 112-3 may have a circular profile, an oval profile, an elliptical profile, or the like from a top view.

In some embodiments, each of the capacitor structures 112-1 and 112-3 may include a first electrode, a capacitor dielectric, and a second electrode. In some embodiments, the capacitor dielectric may surround the first electrode. In some embodiments, the second electrode may surround the first electrode. In some embodiments, the second electrode may surround the capacitor dielectric. In some embodiments, the capacitor dielectric may be disposed between the first electrode and the second electrode.

The first electrode and/or second electrode may include a semiconductor material or a conductive material. The semiconductor material may include polysilicon or other suitable materials. The conductive material may include tungsten, copper, aluminum, tantalum, or other suitable materials.

The capacitor dielectric may include dielectric materials, such as silicon oxide, tungsten oxide, zirconium oxide, copper oxide, aluminum oxide, hafnium oxide, or the like.

The semiconductor device 100 may further include contact plugs 114. In some embodiments, the contact plug 114 may be disposed on the capacitor structure 112. In some embodiments, the contact plug 114 may be configured to connect the capacitor structure 112 and the channel layer 144. In some embodiments, the contact plug 114 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

The semiconductor device 100 may further include an isolation layer 116. The isolation layer 116 may separate the plurality of capacitor structures 112. The isolation layer 116 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. The dielectric layer contact plug 114 may also be referred to as an interlayer dielectric.

As shown in FIG. 1B, the gate dielectric layer 142 may extend between the contact plug 114 and the landing pad 150. The gate dielectric layer 142 may penetrate the dielectric structure 120. The gate dielectric layer 142 may penetrate the word line 130.

The channel layer 144 may extend between the contact plug 114 and the landing pad 150. The channel layer 144 may penetrate the dielectric structure 120. The channel layer 144 may penetrate the word line 130.

FIG. 2 is a flowchart illustrating a method 200 of manufacturing a semiconductor device, in accordance with some embodiments of the present disclosure.

The method 200 may begin with operation 201 in which a substrate is provided. The substrate may include capacitor structures therein.

The method 200 may continue with operation 202 in which a metallization layer is formed over the substrate.

The method 200 may continue with operation 203 in which a sacrificial layer is formed to penetrate the metallization layer.

The method 200 may continue with operation 204 in which a mask pattern is formed over the sacrificial layer.

The method 200 may continue with operation 205 in which a width controlling structure is formed on a lateral surface of the mask pattern.

The method 200 may continue with operation 206 in which a protection layer is formed.

The method 200 may continue with operation 207 in which the width controlling structure is removed.

The method 200 may continue with operation 208 in which the metallization layer is patterned to form a word line.

The method 200 may continue with operation 209 in which the sacrificial layer is removed to form an opening.

The method 200 may continue with operation 210 in which a channel layer is formed within the opening.

The method 200 may continue with operation 211 in which a landing pad is formed on the channel layer.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 2. In some embodiments, the method 200 can include one or more operations depicted in FIG. 2.

FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A illustrate one or more stages of an exemplary method for manufacturing a semiconductor device according to some embodiments of the present disclosure. FIG. 3B, FIG. 4B, FIG. 5B, FIG. 6B, FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, and FIG. 19B are cross-sections of FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, and FIG. 19A, respectively. It should be noted that, for brevity, some elements are illustrated in cross-section but not in top views.

Figure 3A:
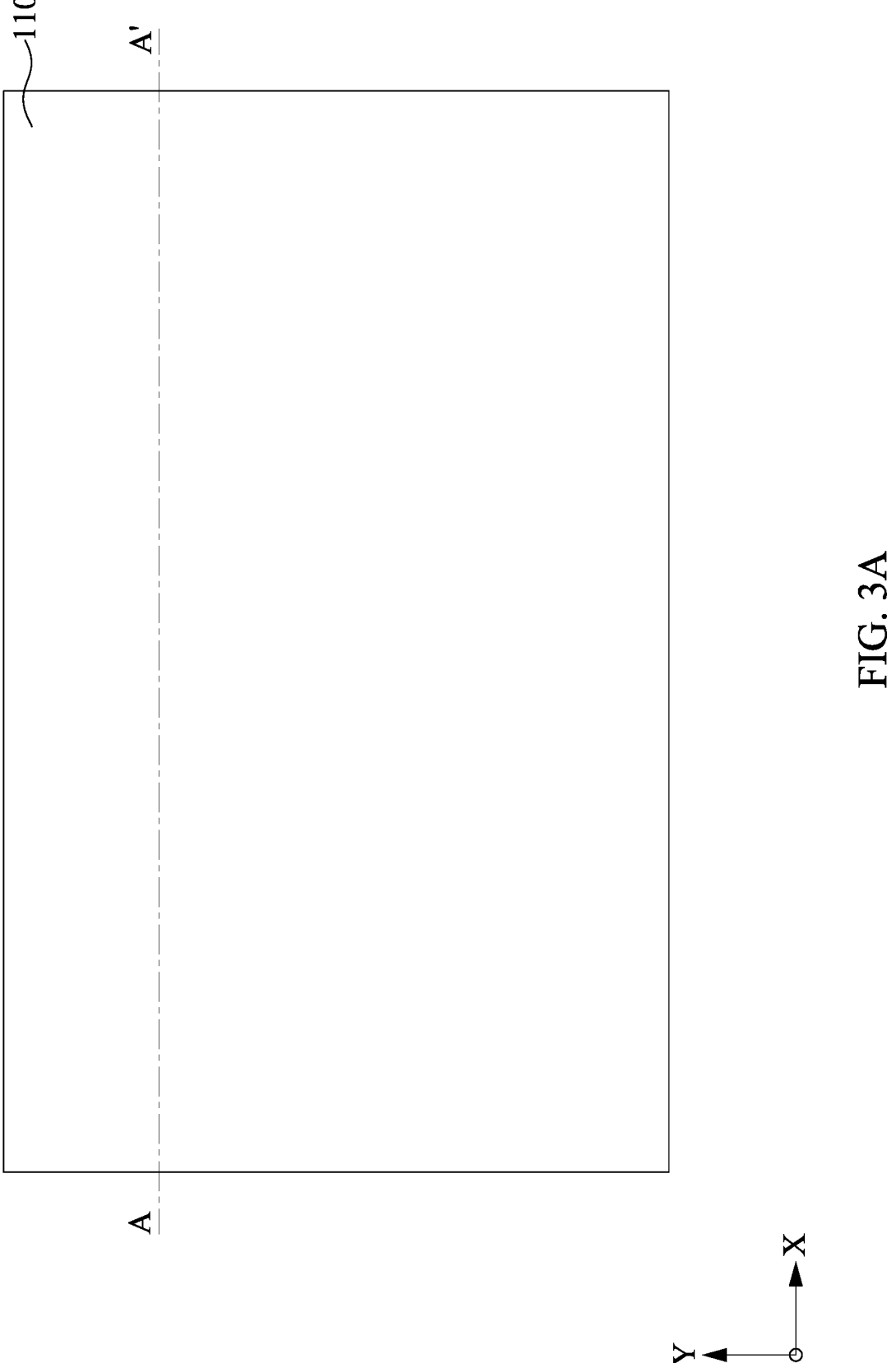
FIG. 3A illustrates one or more stages of an exemplary method for manufacturing a semiconductor device according to some embodiments of the present disclosure.

Referring to FIG. 3A and FIG. 3B, a substrate 110 may be provided. In some embodiments, a plurality of capacitor structures 112 (e.g., 112-1 and 112-3) may be formed within the substrate 110. The capacitor structure 112-1 may be aligned with the capacitor structure 112-3 along the X-axis. In some embodiments, the capacitor structure 112 may have a circular, elliptical, oval, or other suitable profile. However, the present disclosure is not intended to be limiting. In some embodiments, contact plugs 114 may be formed on the capacitor structure 112. In some embodiments, an isolation layer 116 may be formed on the substrate 110. The isolation layer 116 may be configured to separate the contact plugs 114.

Figure 4A:
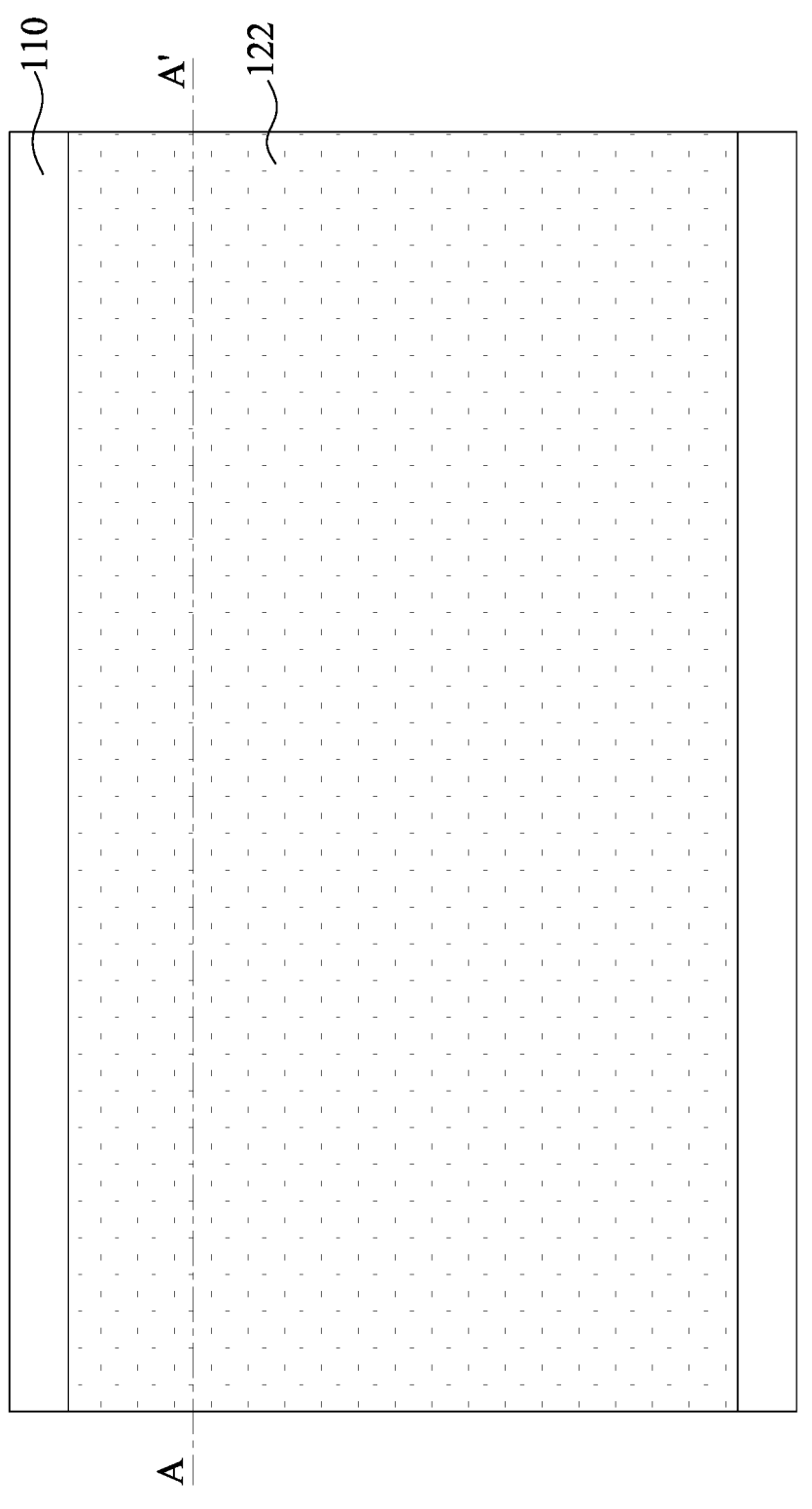
FIG. 4A illustrates one or more stages of an exemplary method for manufacturing a semiconductor device according to some embodiments of the present disclosure.
Figure 4B:
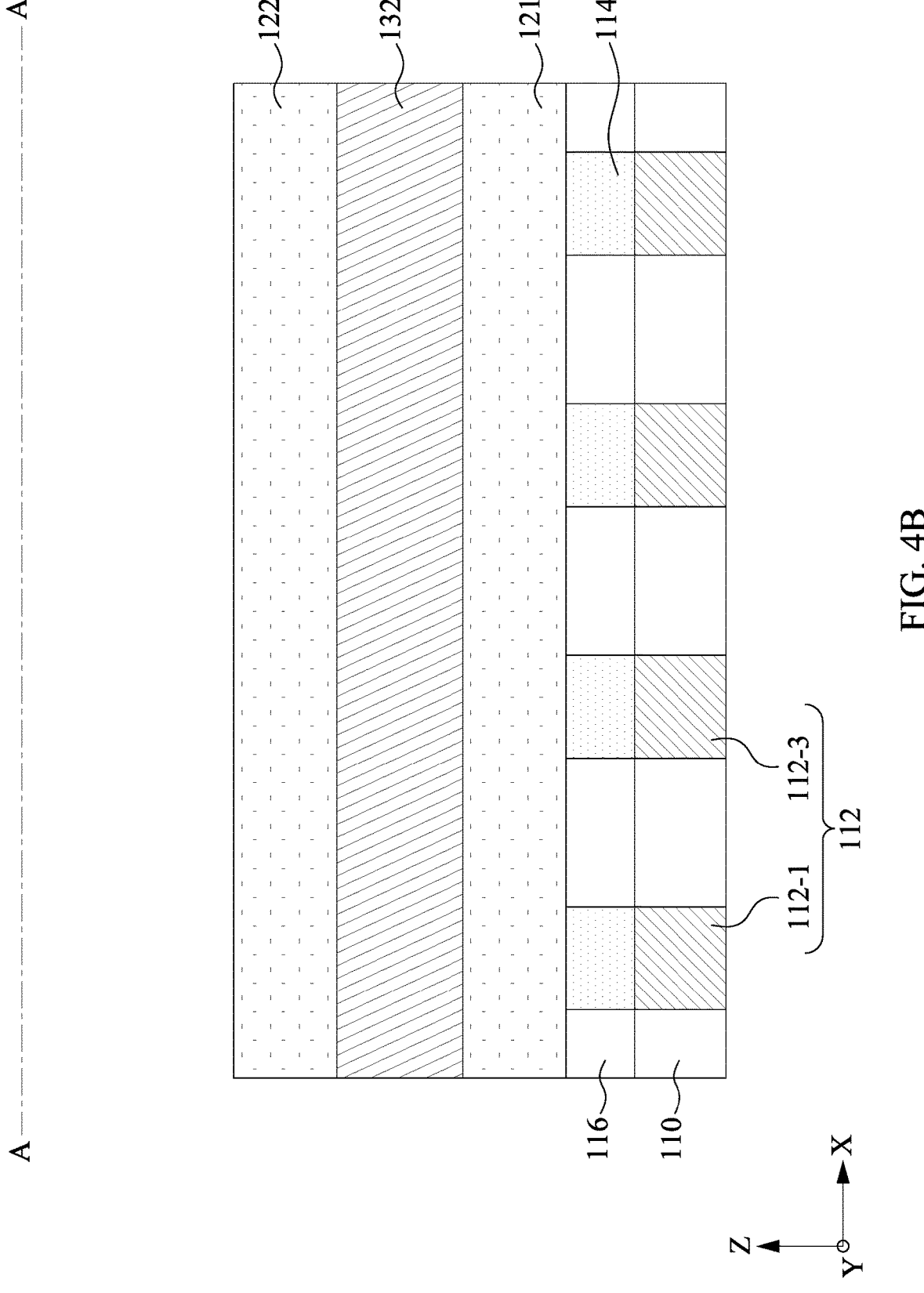
FIG. 4B is a cross-section along line A-A' of FIG. 4A, in accordance with some embodiments of the present disclosure.

Referring to FIG. 4A and FIG. 4B, a dielectric layer 121, a metallization layer 132, and a dielectric layer 122 may be formed on the substrate 110. In some embodiments, the dielectric layer 121 (or a lower dielectric layer) may be formed on the substrate 110. In some embodiments, the metallization layer 132 may be formed on the dielectric layer 121. In some embodiments, the dielectric layer 122 (or an upper dielectric layer) may be formed on the metallization layer 132. The dielectric layer 121 and/or 122 may include silicon oxide ($SiO_x$), silicon nitride ($Si_xN_y$), silicon oxynitride (SiON), or other suitable materials. The metallization layer 132 may be configured to form word lines. The dielectric layer 121, dielectric layer 122, and metallization layer 132 may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes.

Figure 5A:
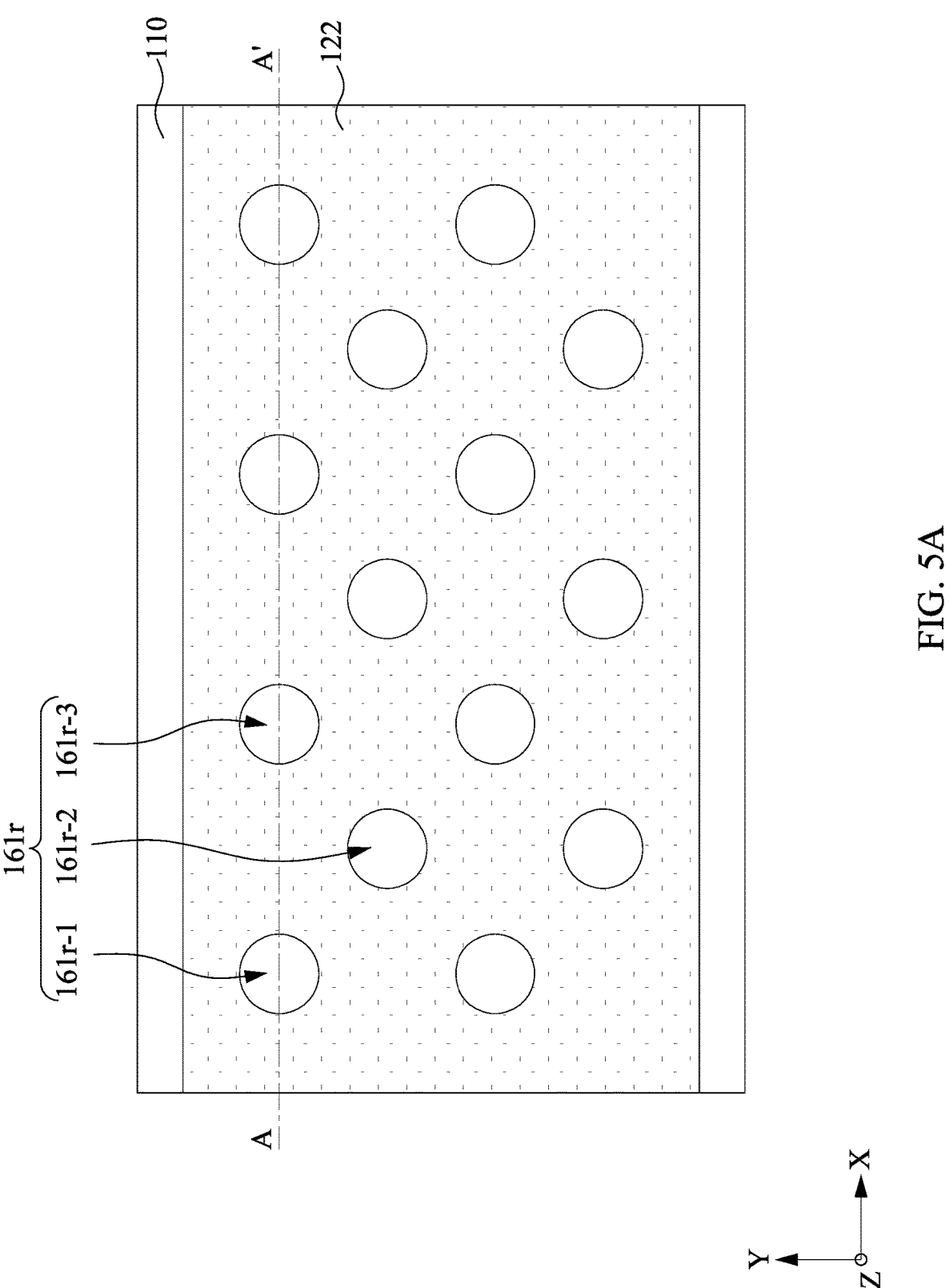
FIG. 5A illustrates one or more stages of an exemplary method for manufacturing a semiconductor device according to some embodiments of the present disclosure.
Figure 5B:
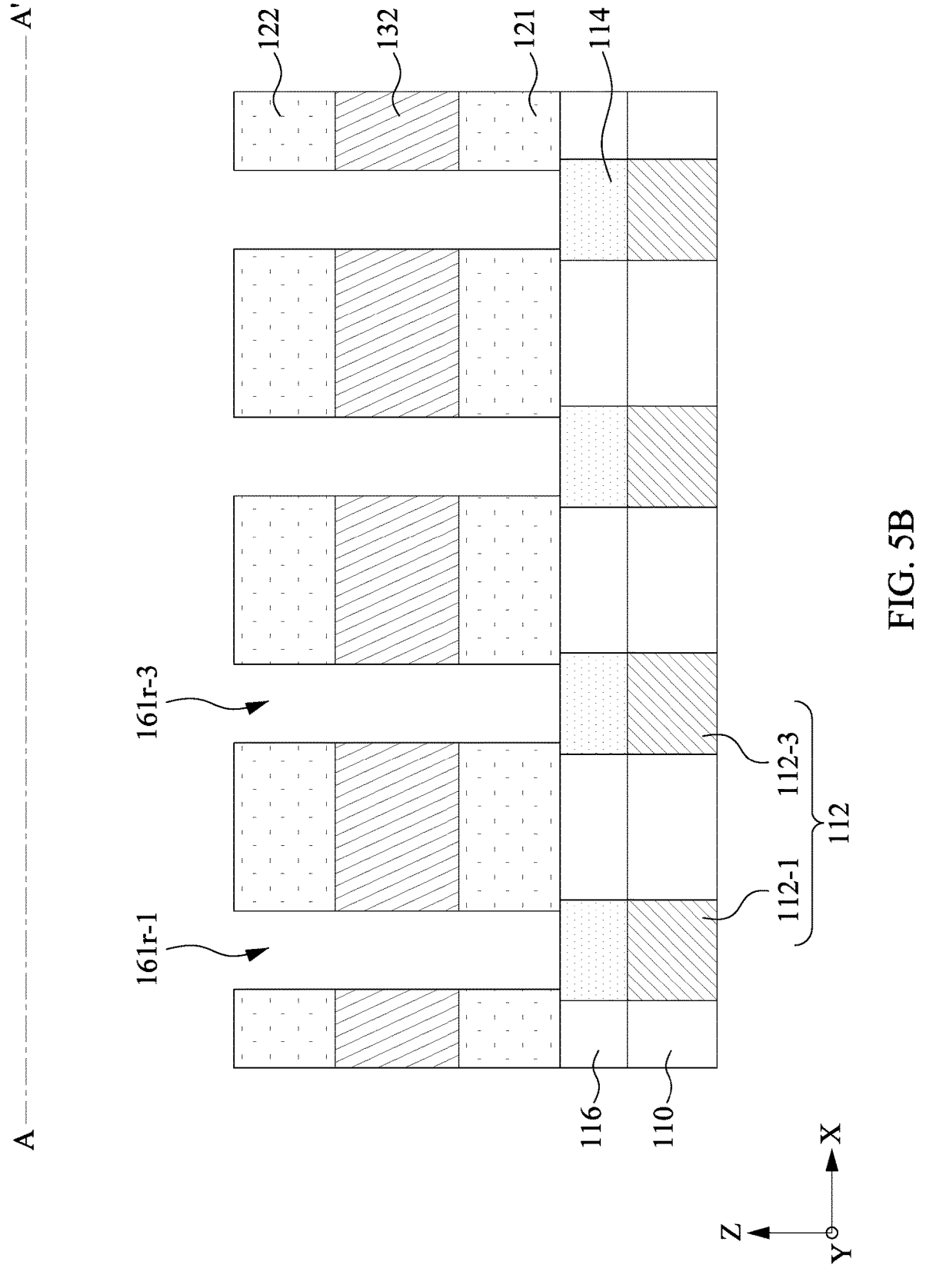
FIG. 5B is a cross-section along line A-A' of FIG. 5A, in accordance with some embodiments of the present disclosure.

Referring to FIG. 5A and FIG. 5B, a plurality of openings 161r (e.g., 161r-1, 161r-2, and 161r-3) are formed. A portion of the dielectric layer 121, dielectric layer 122, and metallization layer 132 may be removed. In some embodiments, the opening 161r may penetrate the dielectric layer 121, dielectric layer 122, and metallization layer 132. In some embodiments, the isolation layer 116 may be exposed by the opening 161r. In some embodiments, the opening 161r-1 may be aligned with the opening 161r-3 along the X-axis. The opening 161r-1 may be misaligned with the opening 161r-2 along the X-axis.

Figure 6A:
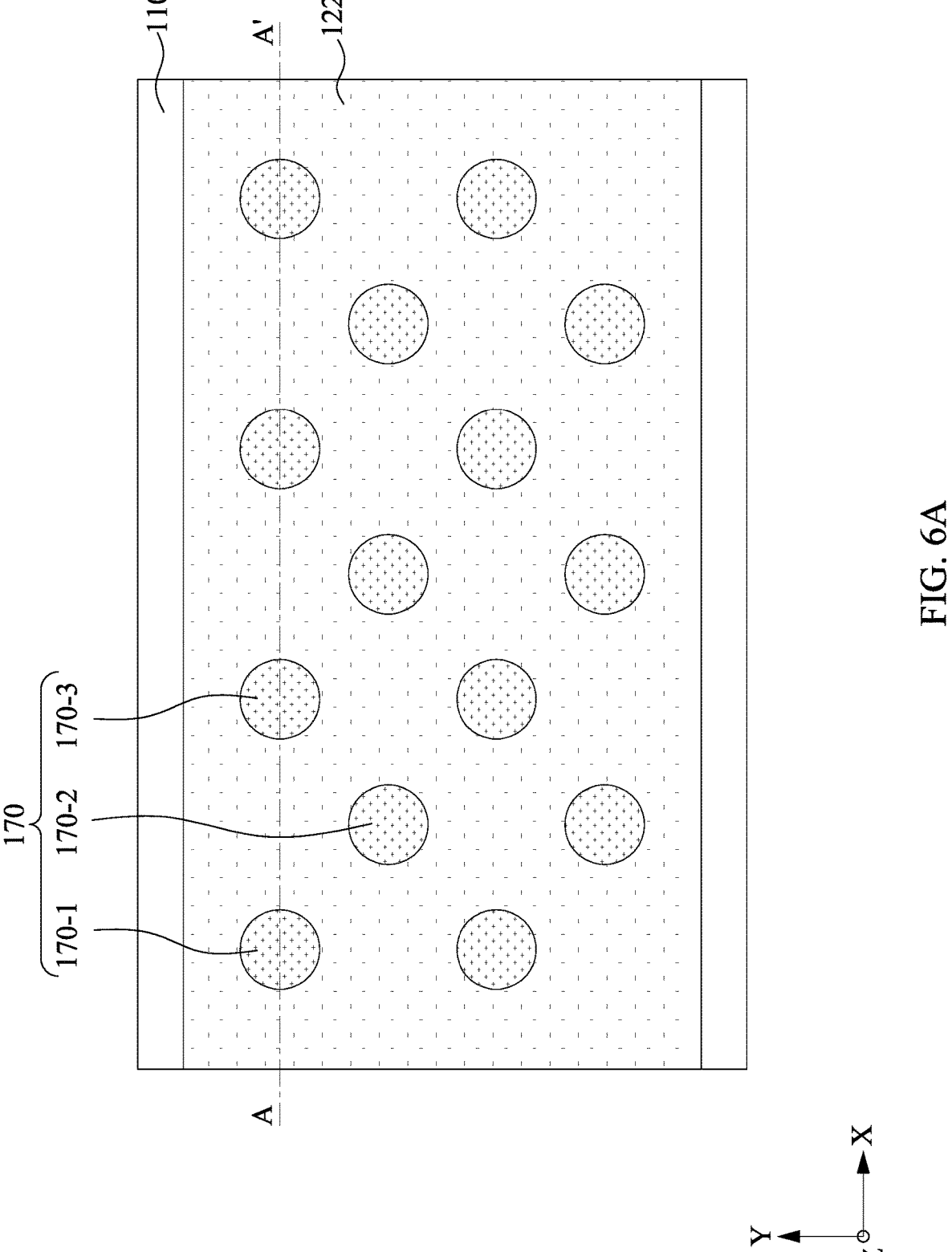
FIG. 6A illustrates one or more stages of an exemplary method for manufacturing a semiconductor device according to some embodiments of the present disclosure.
Figure 6B:
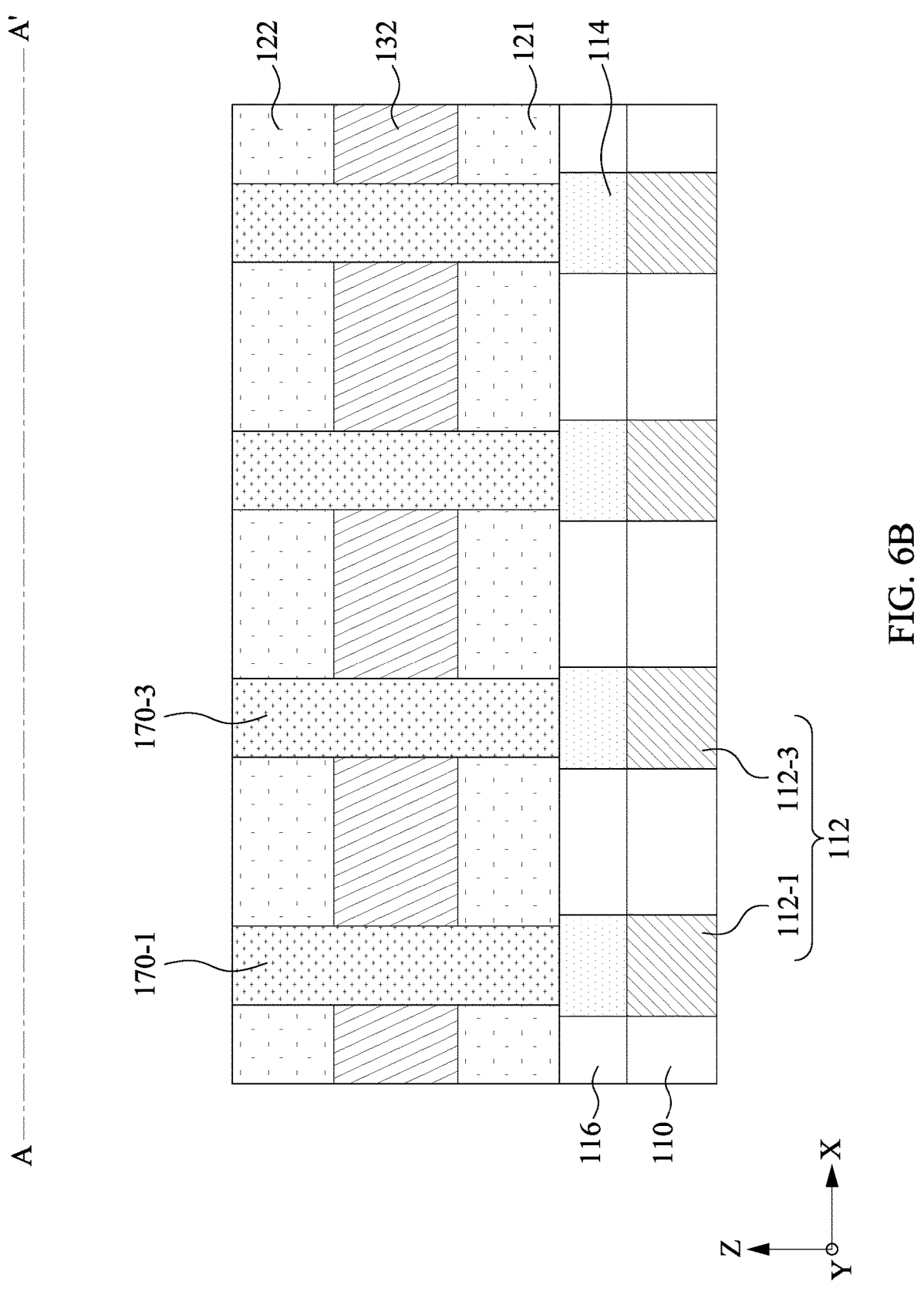
FIG. 6B is a cross-section along line A-A' of FIG. 6A, in accordance with some embodiments of the present disclosure.

Referring to FIG. 6A and FIG. 6B, a plurality of sacrificial layers 170 (e.g., 170-1, 170-2, and 170-3) may be formed. For example, the sacrificial layer 170-1 may be formed within the opening 161r-1. The sacrificial layer 170-2 may be formed within the opening 161r-2. The sacrificial layer 170-3 may be formed within the opening 161r-3. In some embodiments, the sacrificial layer 170 may vertically overlap or be aligned with the capacitor structure 112 along the Z-axis. For example, the sacrificial layer 170-1 may vertically overlap the capacitor structure 112-1. The sacrificial layer 170-3 may vertically overlap the capacitor structure 112-3. In some embodiments, the sacrificial layer 170-1 may be aligned with the sacrificial layer 170-3 along the X-axis. The sacrificial layer 170-1 may be misaligned with the sacrificial layer 170-2 along the X-axis.

In some embodiments, the material of the sacrificial layer 170 is different from that of the dielectric layer 121 (or 122). In some embodiments, the material of the sacrificial layer 170 is different from that of the metallization layer 132. In some embodiments, the sacrificial layer 170 may include polysilicon, gallium nitride, aluminum gallium nitride, titanium nitride, tantalum nitride, or other suitable materials. The sacrificial layer 170 may be formed by CVD, ALD, PVD, LPCVD, PECVD, or other suitable processes.

Figure 7A:
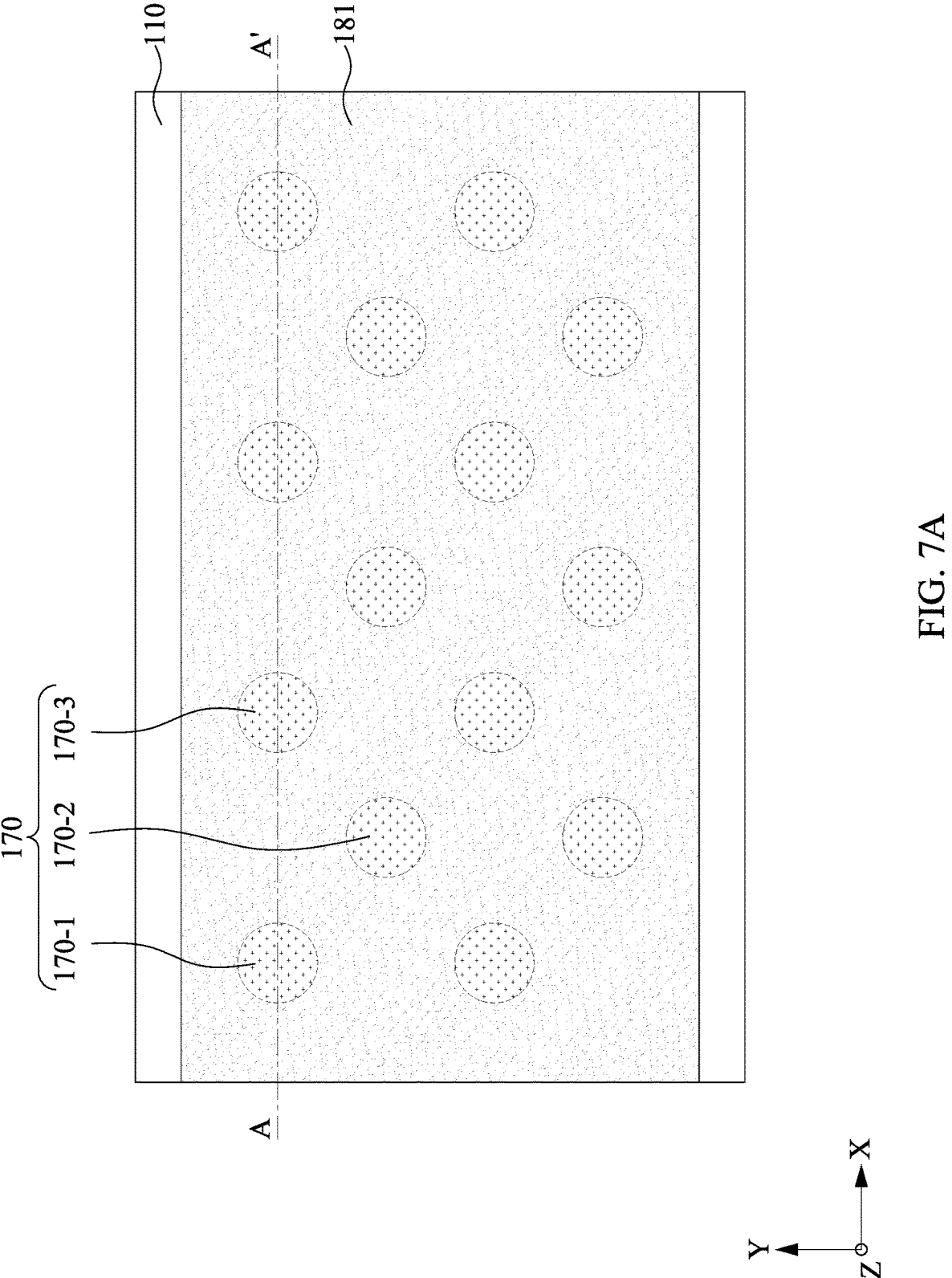
FIG. 7A illustrates one or more stages of an exemplary method for manufacturing a semiconductor device according to some embodiments of the present disclosure.
Figure 7B:
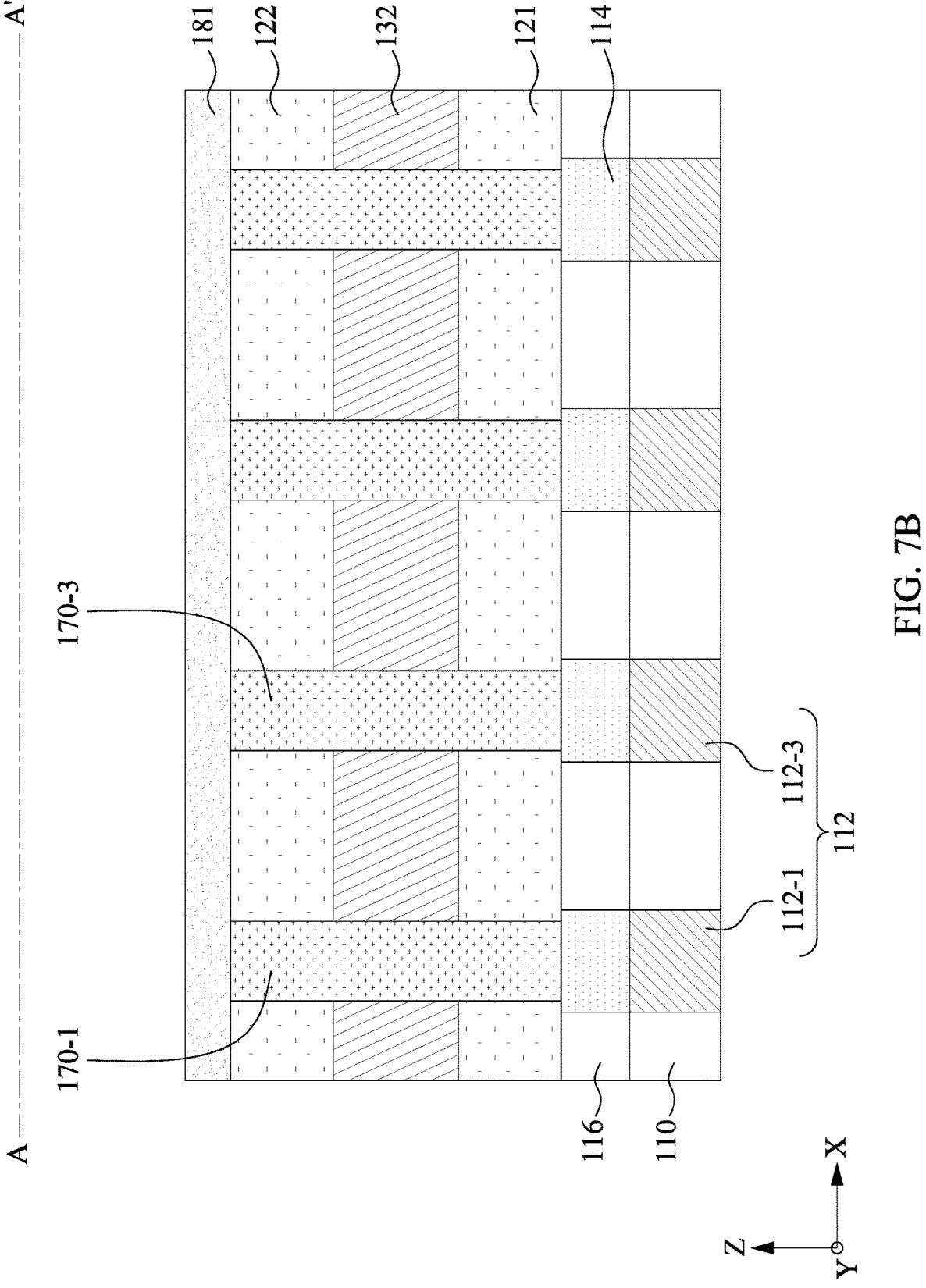
FIG. 7B is a cross-section along line A-A' of FIG. 7A, in accordance with some embodiments of the present disclosure.

Referring to FIG. 7A and FIG. 7B, a mask element 181 may be formed on the dielectric layer 122. The mask element 181 may cover the sacrificial layers 170. In some embodiments, the material of the mask element 181 may be different from that of the dielectric layer 122. The mask element 181 may include a dielectric layer. In some embodiments, the material of the mask element 181 may include carbon, silicon oxide ($SiO_2$), such as flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG) or other suitable materials. In some embodiments, the mask element 181 may be formed by, for example, a spin coating technique, a deposition technique, or other suitable techniques.

Figure 8A:
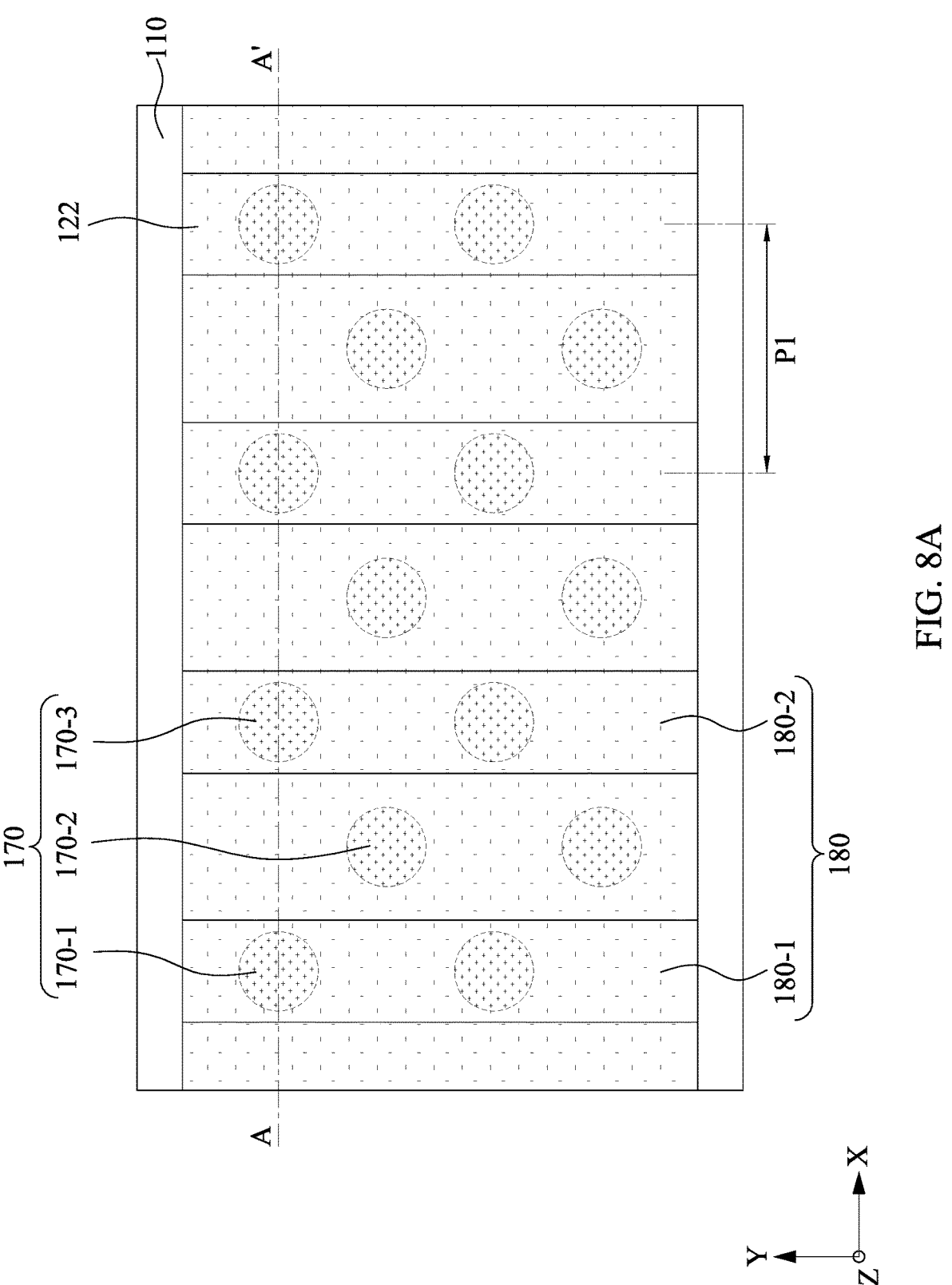
FIG. 8A illustrates one or more stages of an exemplary method for manufacturing a semiconductor device according to some embodiments of the present disclosure.
Figure 8B:
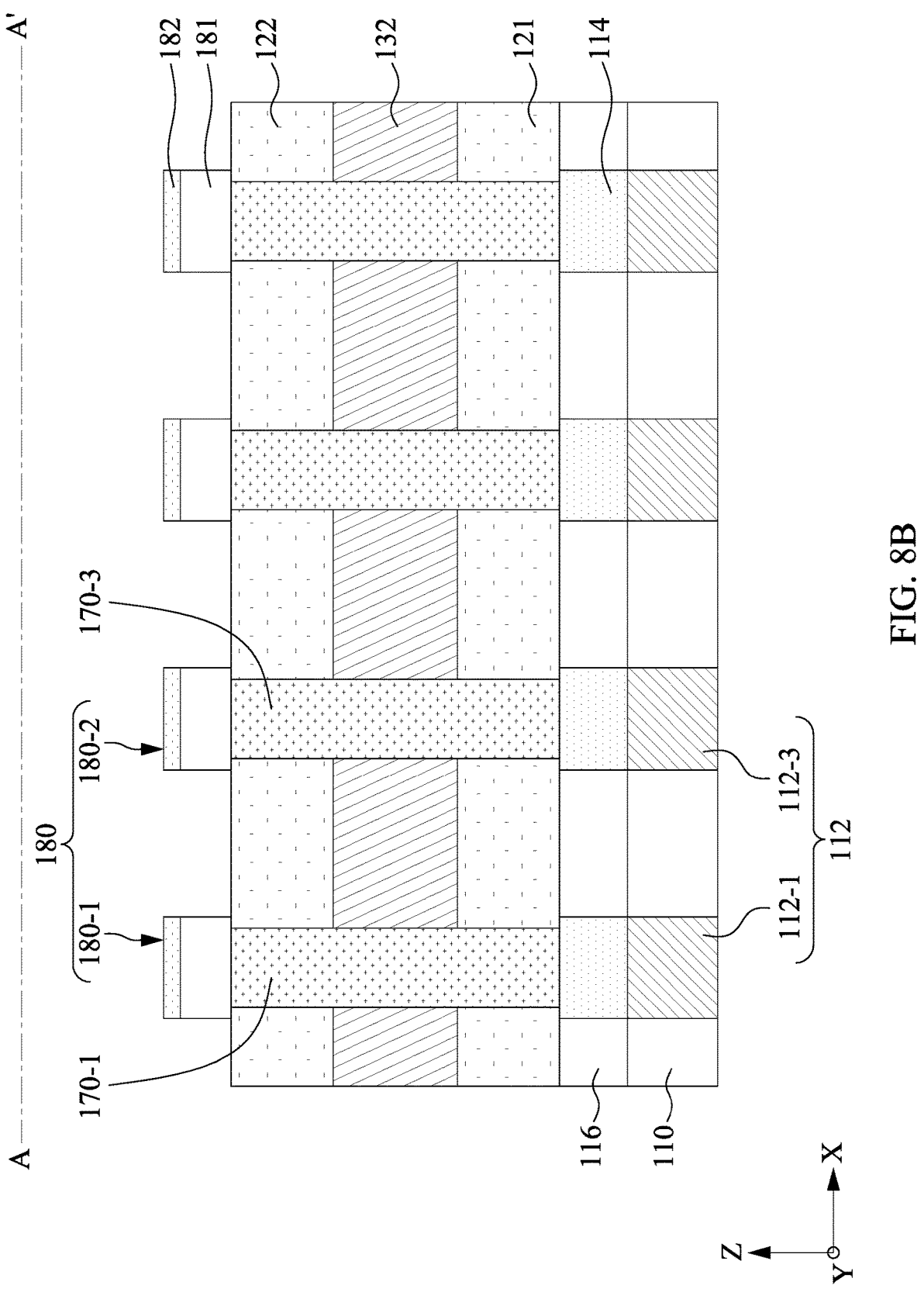
FIG. 8B is a cross-section along line A-A' of FIG. 8A, in accordance with some embodiments of the present disclosure.

Referring to FIG. 8A and FIG. 8B, a mask element 182 may be formed. The mask element 182 may be patterned. The mask element 182 may extend along the Y axis. The material of the mask element 182 may be different from that of the mask element 181. The mask element 181 may be patterned. In some embodiments, the material of the mask element 182 may include, for example, a photoresist.

A mask pattern 180 may be defined. In some embodiments, the mask pattern 180 may include the mask layer 180-1 and the mask layer 180-2. In some embodiments, each of the mask layers 180-1 and 180-2 may extend along the Y-axis. In some embodiments, each of the mask layers 180-1 and 180-2 may include mask elements 181 and 182. In some embodiments, the mask layer 180-1 may vertically overlap the sacrificial layer 170-1. In some embodiments, the mask layer 180-2 may vertically overlap the sacrificial layer 170-3. In some embodiments, the sacrificial layer 170-2 may be free from vertically overlapping the mask pattern 180. The sacrificial layer 170-2 may be exposed by the mask pattern 180. The mask pattern may have a pitch P1 along the X-axis.

Figure 9A:
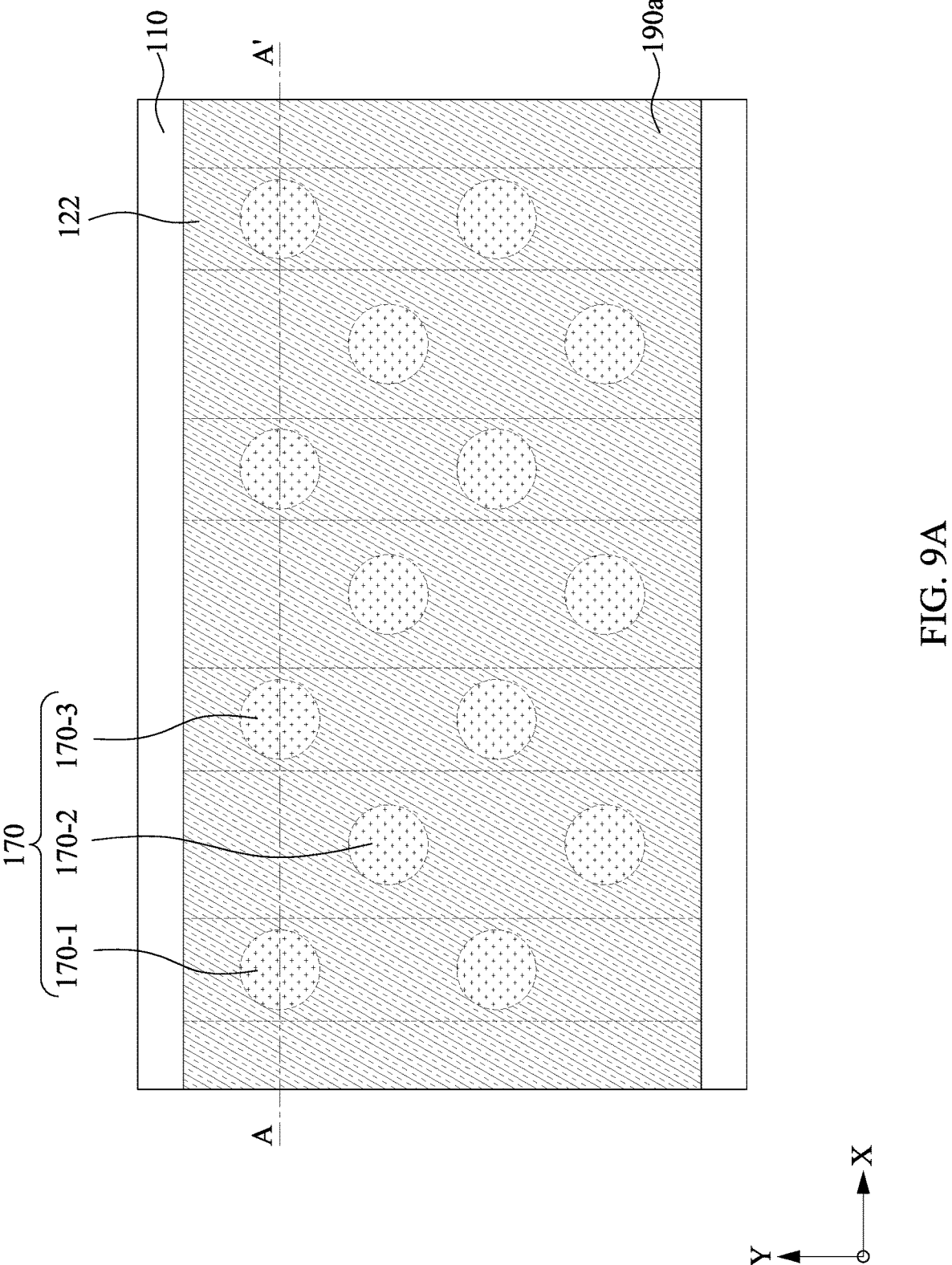
FIG. 9A illustrates one or more stages of an exemplary method for manufacturing a semiconductor device according to some embodiments of the present disclosure.
Figure 9B:
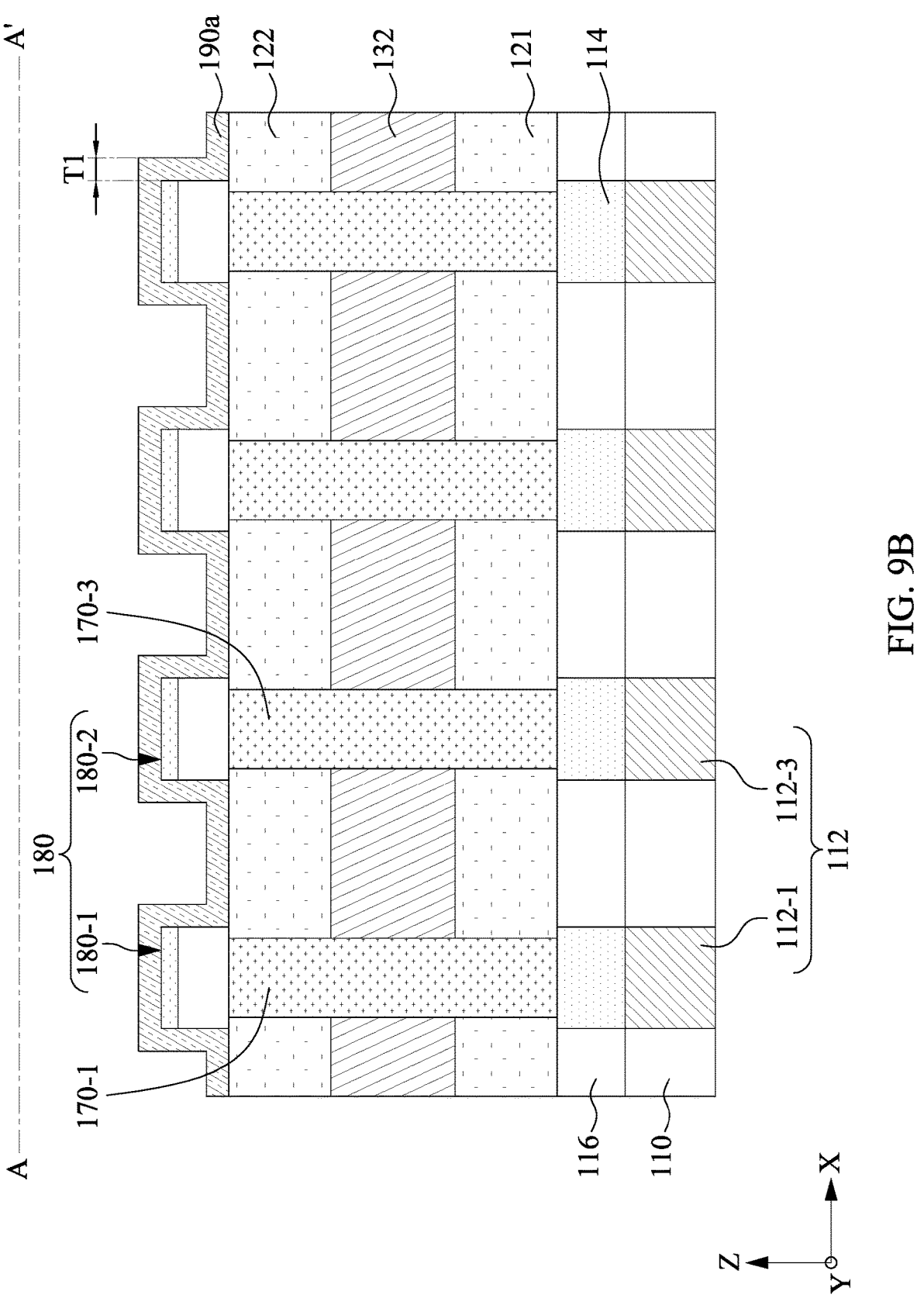
FIG. 9B is a cross-section along line A-A' of FIG. 9A, in accordance with some embodiments of the present disclosure.

Referring to FIG. 9A and FIG. 9B, a width controlling layer 190a may be formed. In some embodiments, the width controlling layer 190a may be conformally formed on the mask pattern 180. In some embodiments, the width controlling layer 190a may be formed on the dielectric layer 122. In some embodiments, the width controlling layer 190a may cover the metallization layer 132.

In some embodiments, the width controlling layer 190a may include silicon nitride ($Si_xN_y$), silicon oxynitride (SiON), or other suitable materials. The width controlling layer 190a may be formed by, for example, ALD, CVD, PVD, LPCVD, PECVD, or other suitable processes.

The width controlling layer 190a may have a thickness T1. In some embodiments, the thickness T1 of the width controlling layer 190a may be utilized to determine a width of a word line, which will be formed subsequently.

Figure 10A:
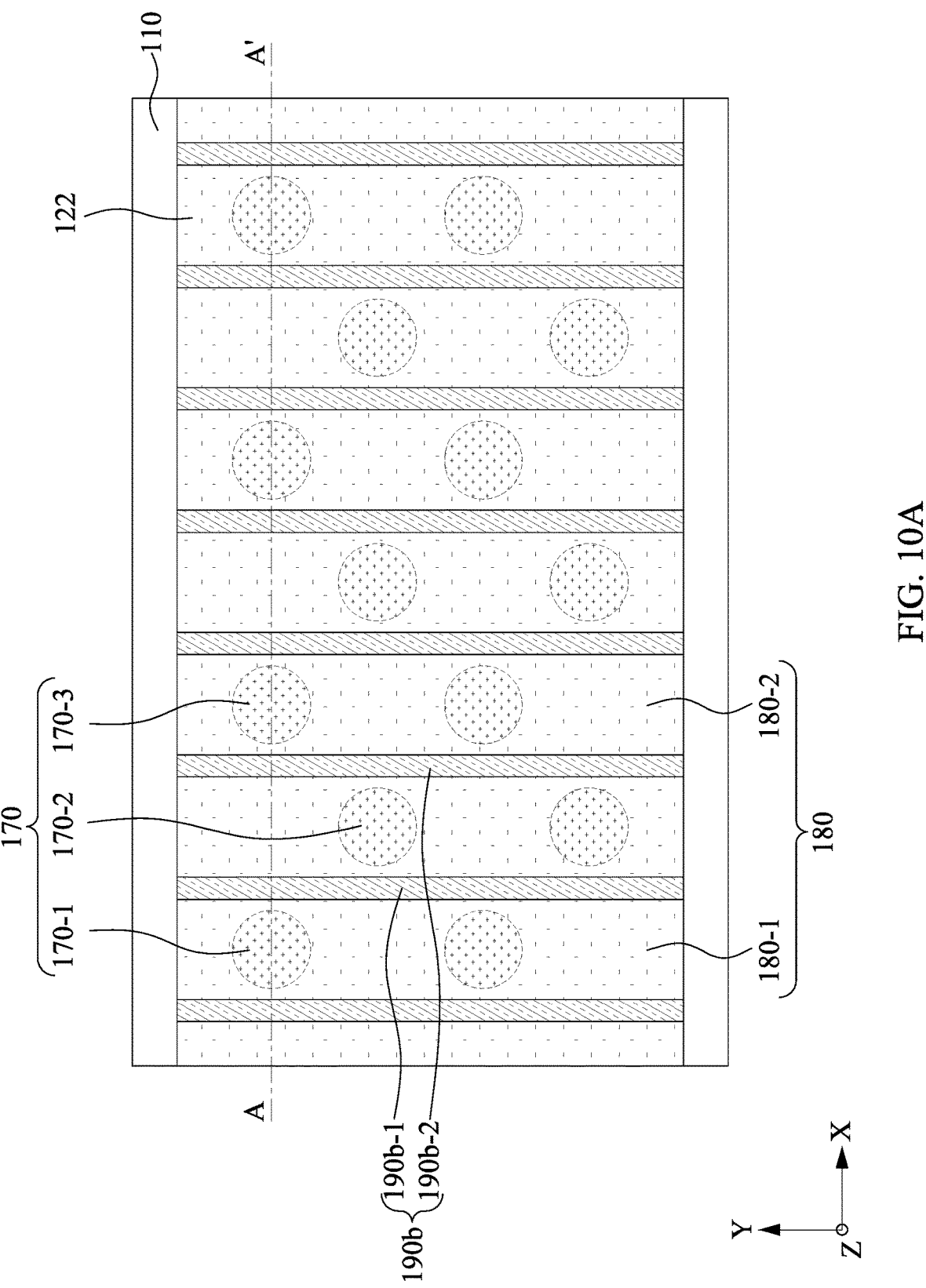
FIG. 10A illustrates one or more stages of an exemplary method for manufacturing a semiconductor device according to some embodiments of the present disclosure.
Figure 10B:
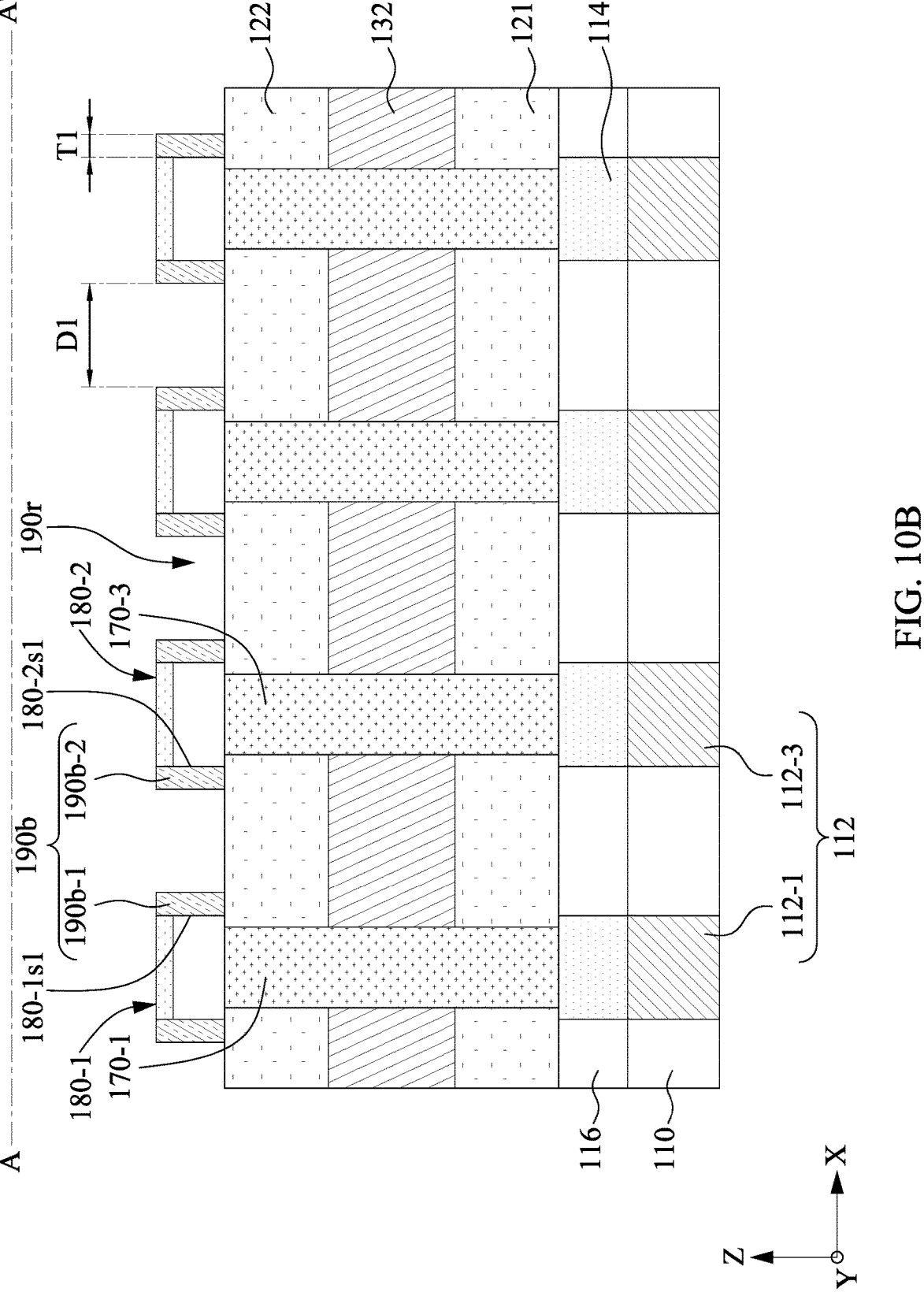
FIG. 10B is a cross-section along line A-A' of FIG. 10A, in accordance with some embodiments of the present disclosure.

Referring to FIG. 10A and FIG. 10B, a width controlling structure 190b may be formed. In some embodiments, the portion of the width controlling layer 190a over the upper surface of the mask pattern 180 may be removed. In some embodiments, the width controlling structure 190b may be formed on or remain on the lateral surface (or sidewall) of the mask pattern 180. In some embodiments, the width controlling structure 190b may be formed on the lateral surface 180-1s1 of the mask layer 180-1. In some embodiments, the width controlling structure 190b may be formed on the lateral surface 180-2s1 of the mask layer 180-2. The lateral surface 180-2s1 of the mask layer 180-2 may face the lateral surface 180-1s1 of the mask layer 180-1.

The width controlling structure 190b may include width controlling elements 190b-1 and 190b-2. Each of the width controlling elements 190b-1 and 190b-2 may extend along the Y axis. Each of the width controlling elements 190b-1 and 190b-2 may have the thickness T1 along the X-axis. The width controlling element 190b-1 may be formed on the lateral surface 180-1s1 of the mask layer 180-1. The width controlling element 190b-2 may be formed on the lateral surface 180-2s1 of the mask layer 180-2. The sacrificial layer 170-2 may be disposed between the width controlling elements 190b-1 and 190b-2.

The width controlling structure 190b may define a gap 190r exposing a portion of the metallization layer 132. In some embodiments, the dimension D1 (or width) of the gap 190r of the width controlling structure 190b may be configured to determine a dimension (or width) of a word line.

In some embodiments, the thickness T1 of the width controlling structure 190b (or controlling elements 190b-1) may be utilized to determine a dimension (or width) of a word line, which will be formed subsequently.

Figure 11A:
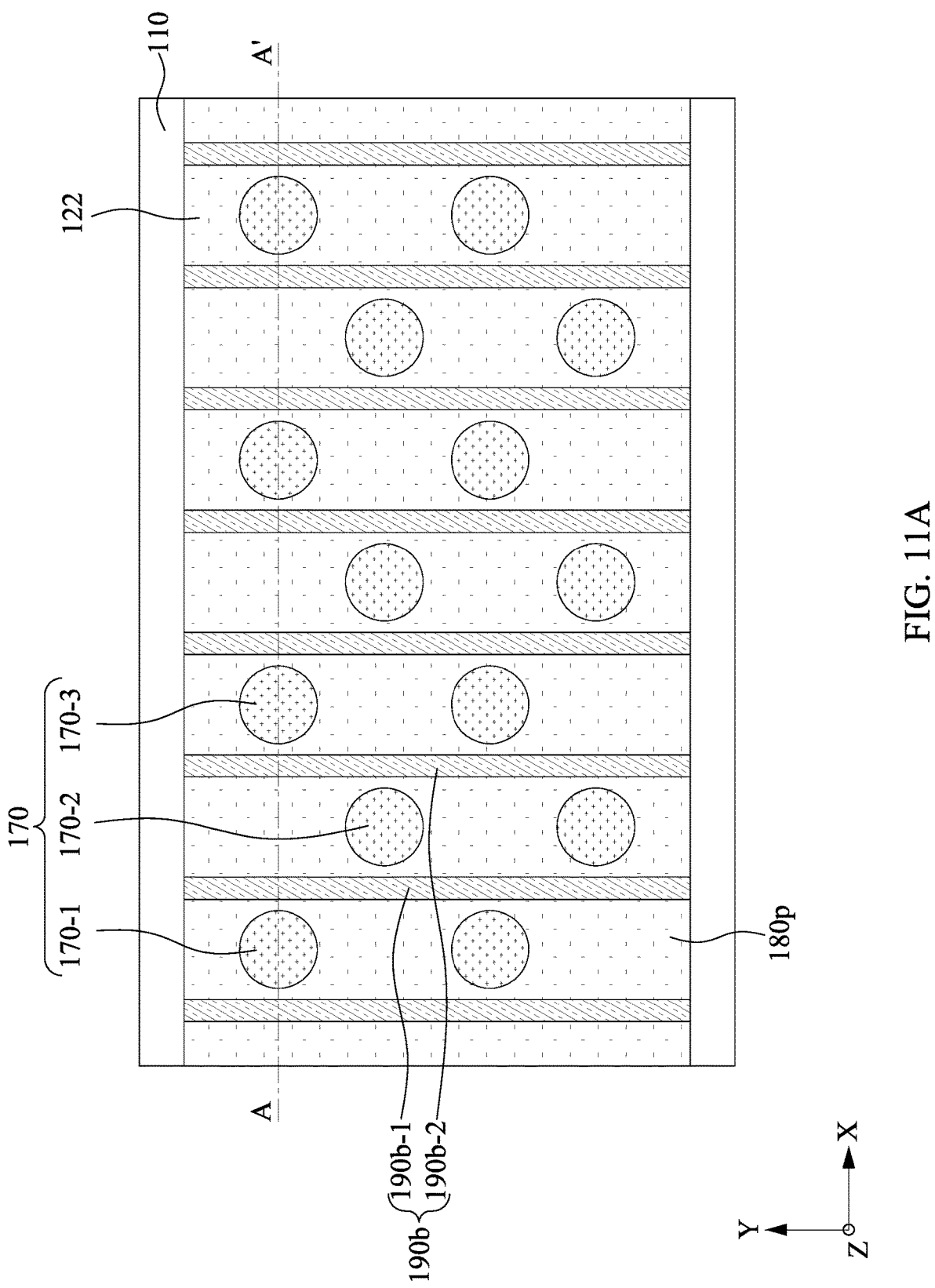
FIG. 11A illustrates one or more stages of an exemplary method for manufacturing a semiconductor device according to some embodiments of the present disclosure.
Figure 11B:
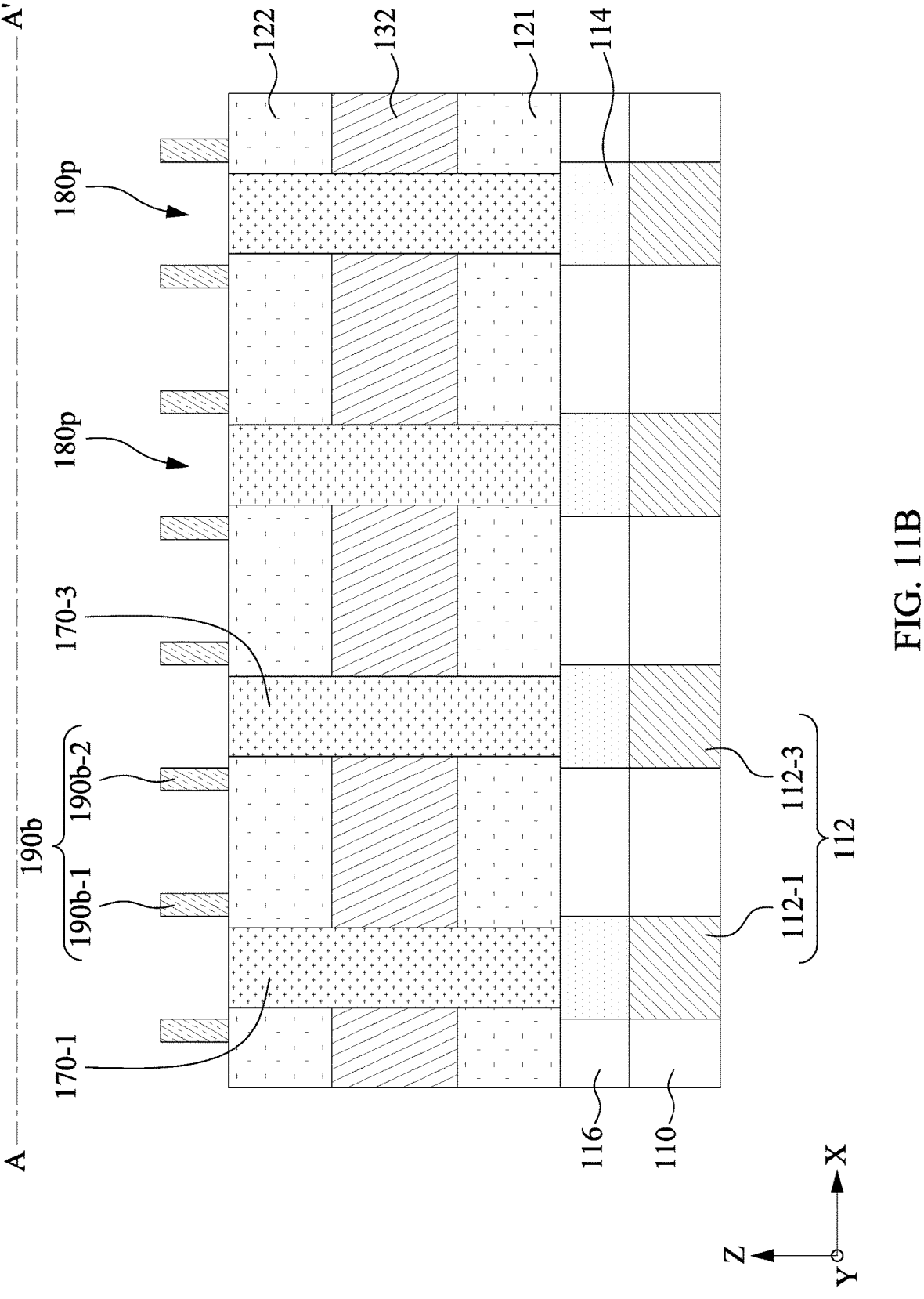
FIG. 11B is a cross-section along line A-A' of FIG. 11A, in accordance with some embodiments of the present disclosure.

Referring to FIG. 11A and FIG. 11B, the mask pattern may be removed. In some embodiments, the mask layers 180-1 and 180-2 may be removed. The sacrificial layers 170-1 and 170-3 may be exposed. Openings 180p may be formed. The sacrificial layers 170-1, 170-2, and 170-3 may be exposed by the openings 180p.

Figure 12A:
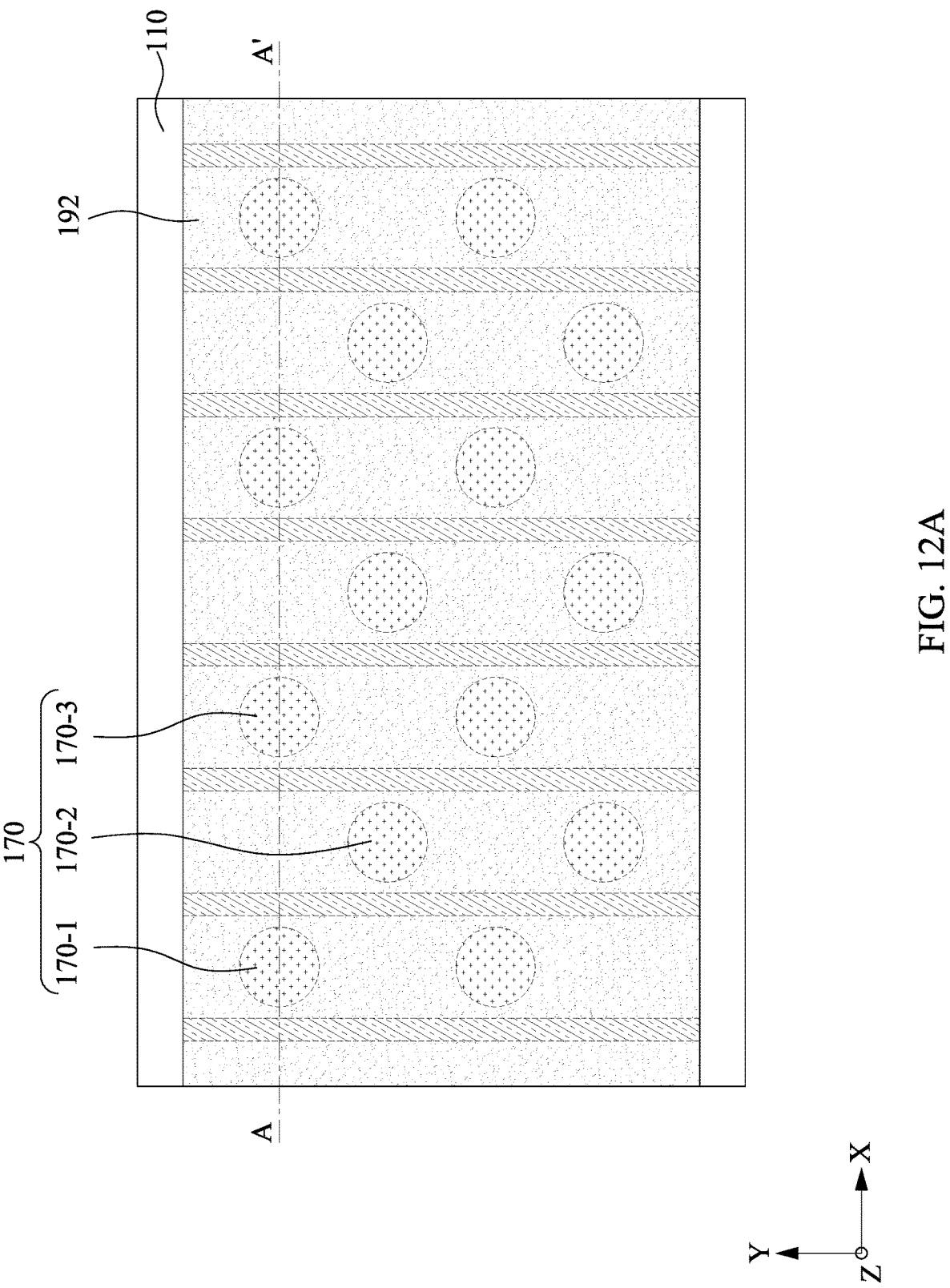
FIG. 12A illustrates one or more stages of an exemplary method for manufacturing a semiconductor device according to some embodiments of the present disclosure.
Figure 12B:
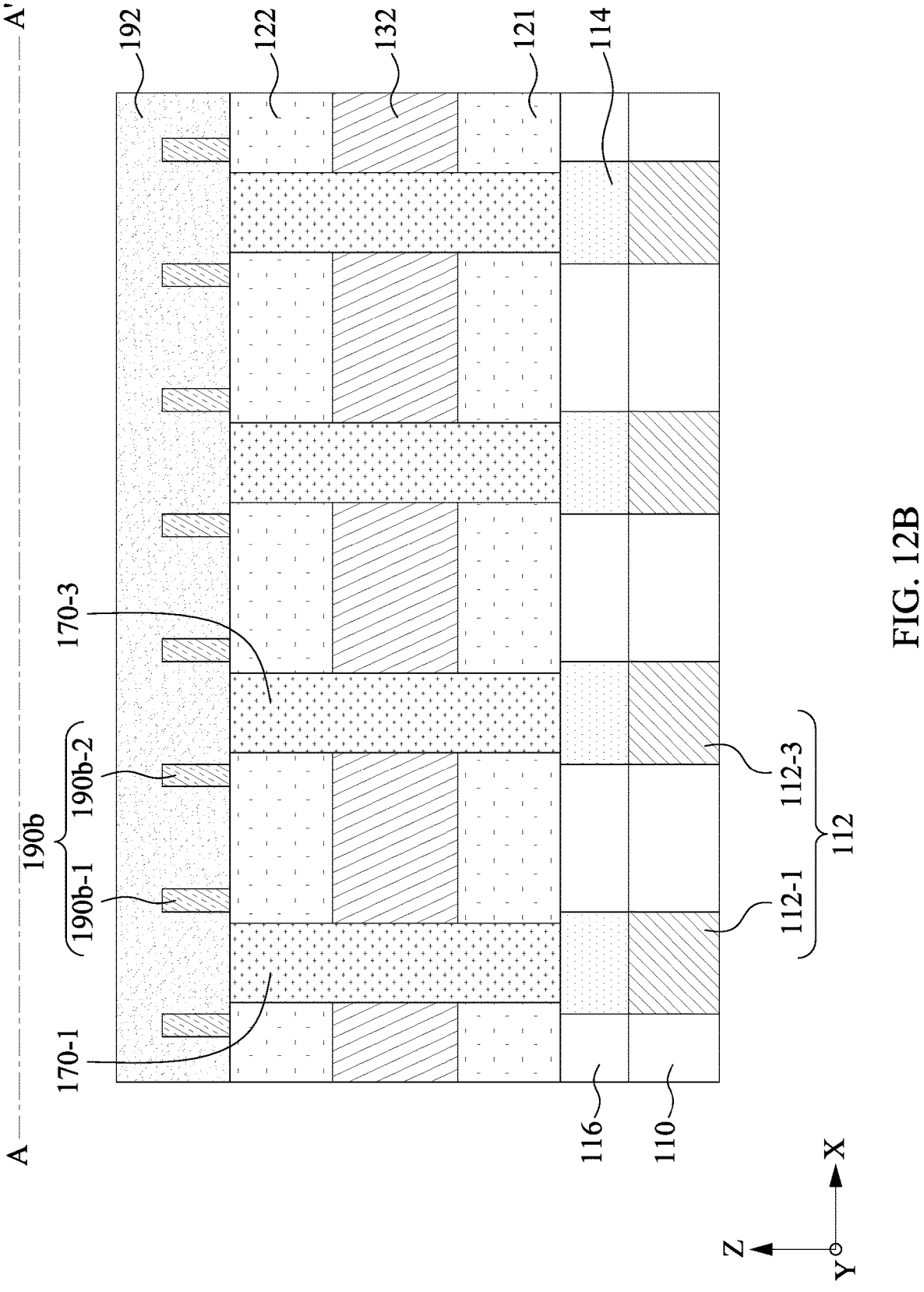
FIG. 12B is a cross-section along line A-A' of FIG. 12A, in accordance with some embodiments of the present disclosure.

Referring to FIG. 12A and FIG. 12B, a protection layer 192 may be formed. In some embodiments, the protection layer 192 may fill in the openings 180p. In some embodiments, the protection layer 192 may cover the sacrificial layers 170-1, 170-2, and 170-3. In some embodiments, the protection layer 192 may cover the dielectric layer 122. The protection layer 192 may include oxide ($SiO_x$), silicon nitride ($Si_xN_y$), silicon oxynitride (SiON), or other suitable materials. The filling layer 125 may be formed by, for example, CVD, ALD, PVD, LPCVD, PECVD, or other suitable processes. In some embodiments, the material of the protection layer 192 may be different from that of the width controlling structure 190b.

Figure 13A:
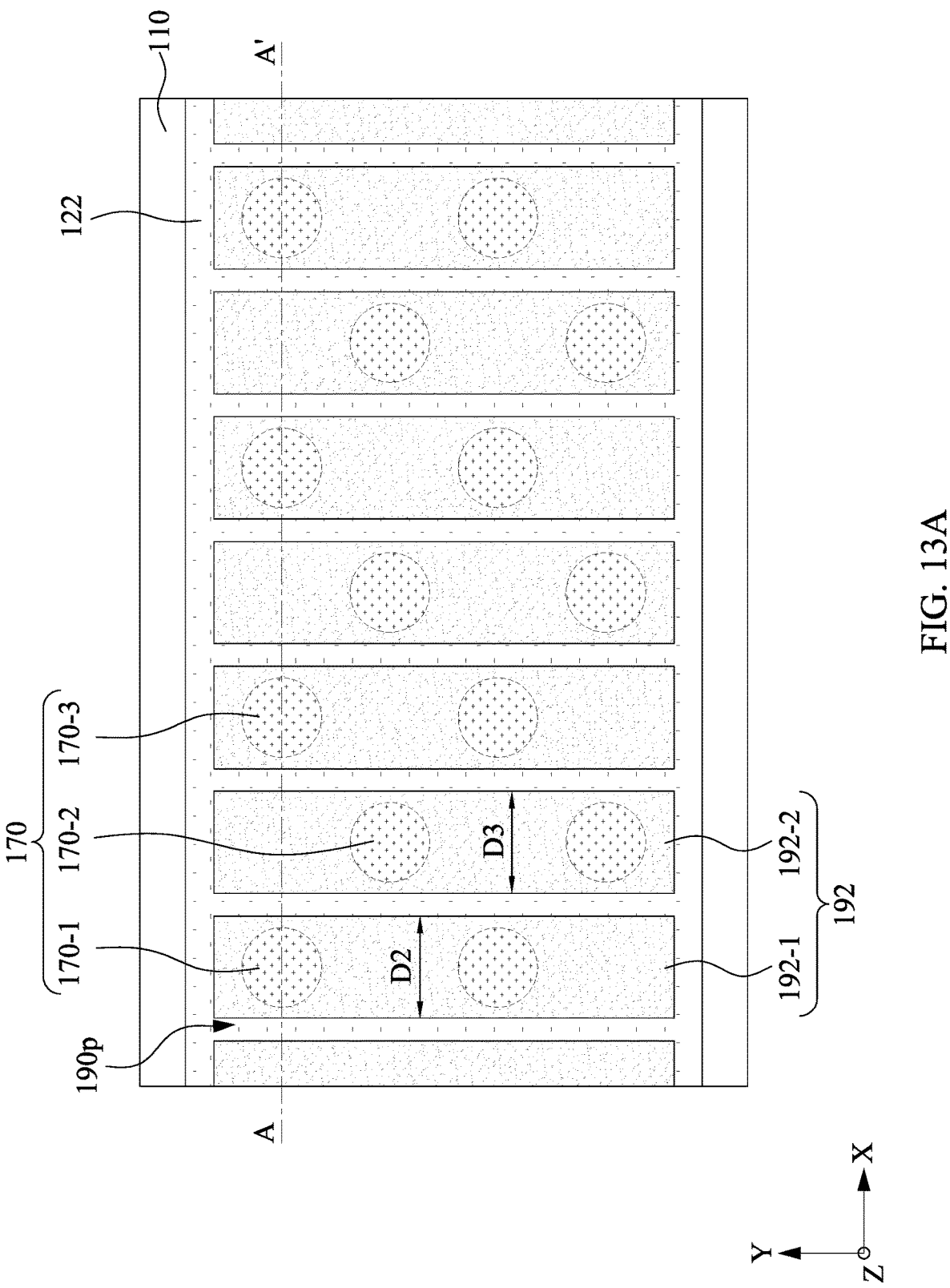
FIG. 13A illustrates one or more stages of an exemplary method for manufacturing a semiconductor device according to some embodiments of the present disclosure.
Figure 13B:
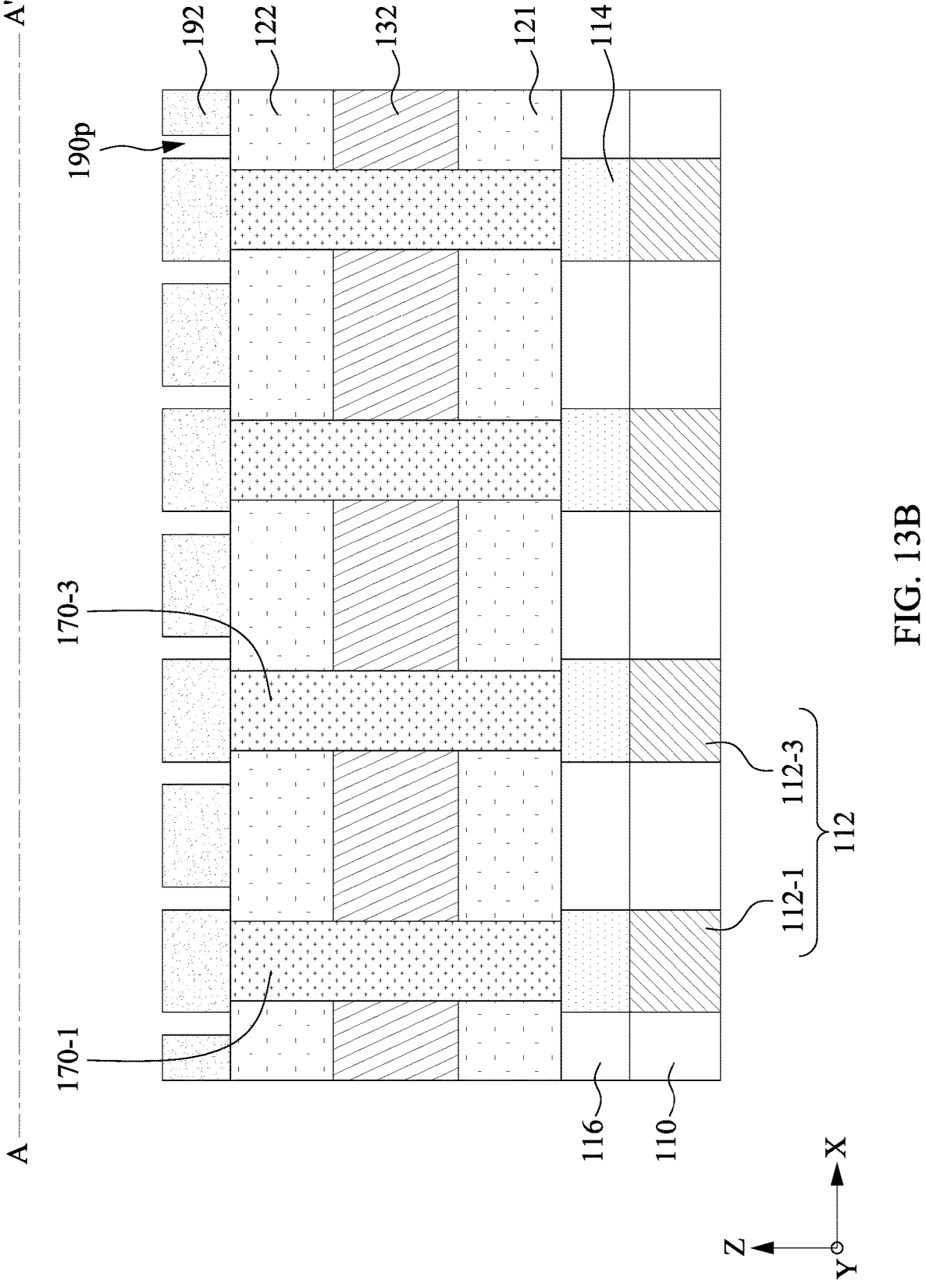
FIG. 13B is a cross-section along line A-A' of FIG. 13A, in accordance with some embodiments of the present disclosure.

Referring to FIG. 13A and FIG. 13B, a grinding technique, such as a chemical mechanical technique, may be performed. The portion of the protection layer 192 over the width controlling structure 190b may be removed, and the width controlling structure 190b may be exposed by the protection layer 192. Next, an etching technique may be performed to remove the width controlling structure 190b. In some embodiments, a portion of the dielectric layer 122 may be exposed by the protection layer 192. In some embodiments, a portion of the metallization layer 132 may be exposed by the protection layer 192. The protection layer 192 may include a portion 192-1 and a portion 192-2 spaced apart from the portion 192-1. In some embodiments, the portion 192-1 may extend along the Y axis. In some embodiments, the portion 192-2 may extend along the Y axis. In some embodiments, the portion 192-1 may cover the sacrificial layers 170-1 and 170-3. In some embodiments, the portion 192-2 may cover the sacrificial layers 170-2. The dimension D2 of the portion 192-1 may be substantially equal to the dimension D3 of the portion 192-2. Openings 190p may be formed. The opening 190p may expose a portion of the metallization layer 132.

Figure 14A:
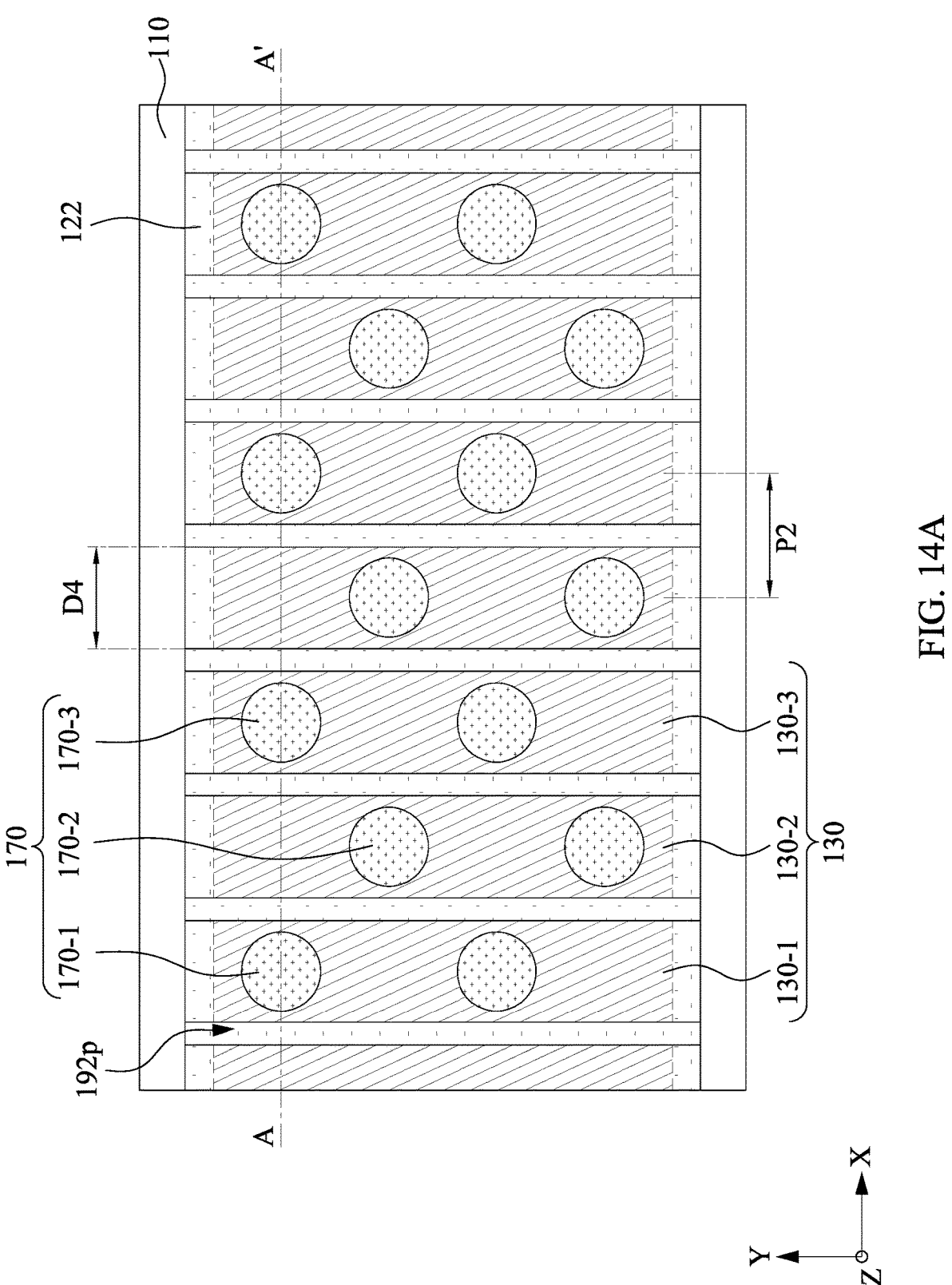
FIG. 14A illustrates one or more stages of an exemplary method for manufacturing a semiconductor device according to some embodiments of the present disclosure.
Figure 14B:
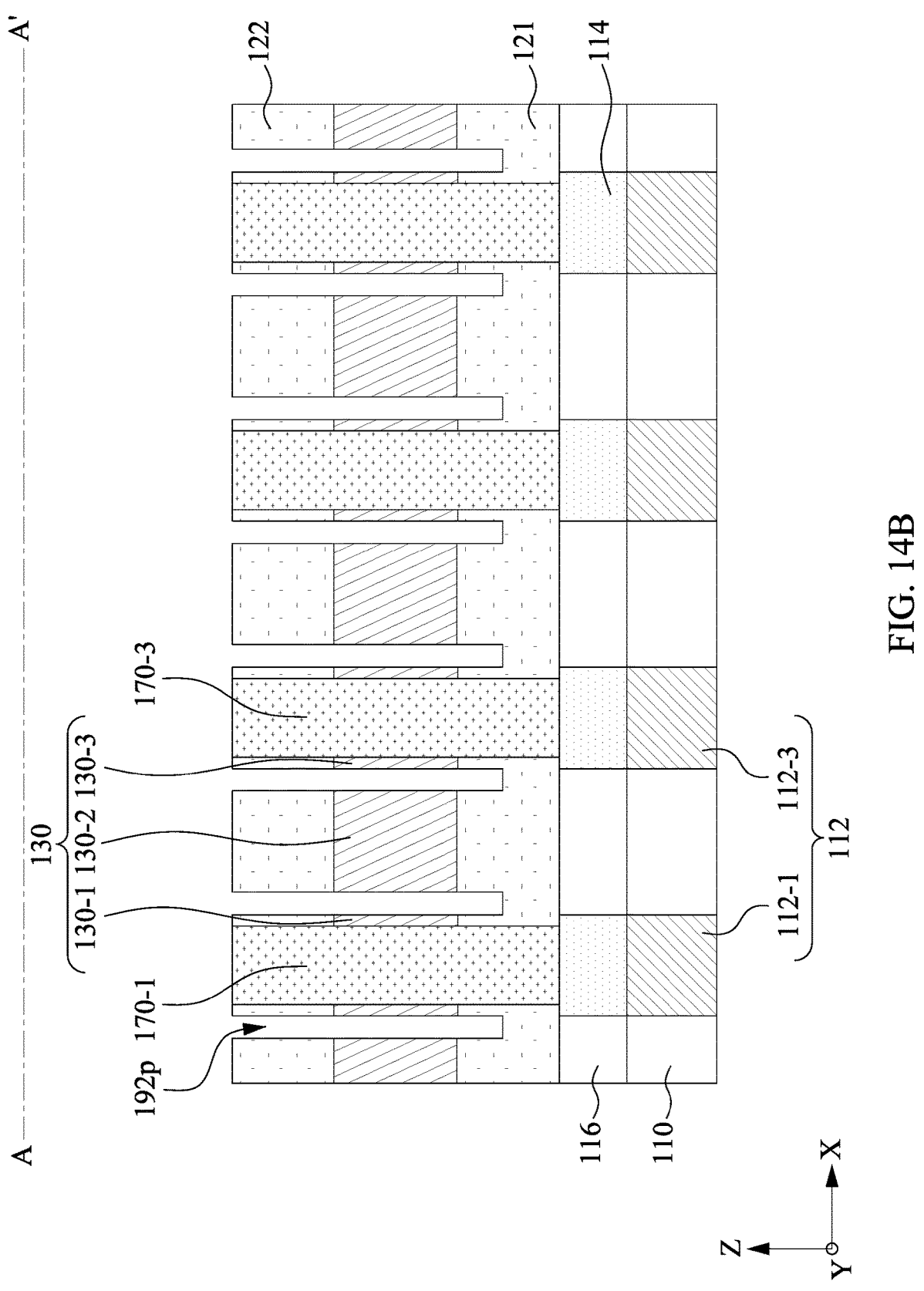
FIG. 14B is a cross-section along line A-A' of FIG. 14A, in accordance with some embodiments of the present disclosure.

Referring to FIG. 14A and FIG. 14B, word lines 130 (e.g., 130-1, 130-2, and 130-3) may be formed. In some embodiments, an etching technique may be performed. The metallization layer 132 exposed by the protection layer 192 may be removed. In some embodiments, a portion of the dielectric layer 121 may be removed. In some embodiments, a portion of the dielectric layer 122 may be removed. In some embodiments, a dimension D4 (e.g., width or length) of the word line 130 may be determined by the thickness T1 of the width controlling structure 190b. In some embodiments, the dimension D4 (e.g., width or length) of the word line 130 may be determined by the dimension D1 of the recess 190r. A recess 192p may be formed. In some embodiments, the recess 192p may be located between the word lines 130. The word line 130 may have a pitch P2 along the X-axis. In some embodiments, the pitch P1 may be different from the pitch P2. In some embodiments, the pitch P2 may be greater than the pitch P1.

Figure 15A:
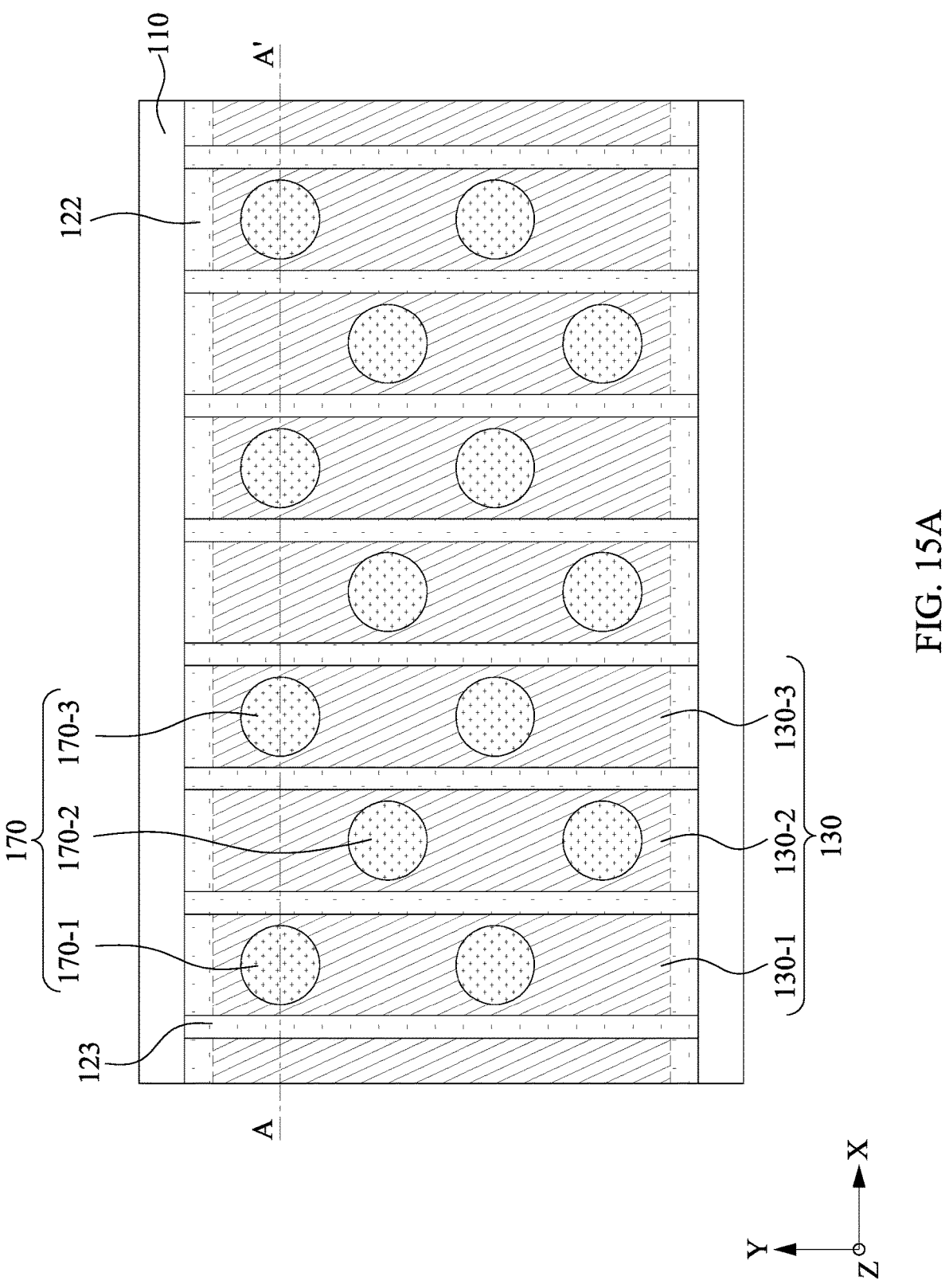
FIG. 15A illustrates one or more stages of an exemplary method for manufacturing a semiconductor device according to some embodiments of the present disclosure.
Figure 15B:
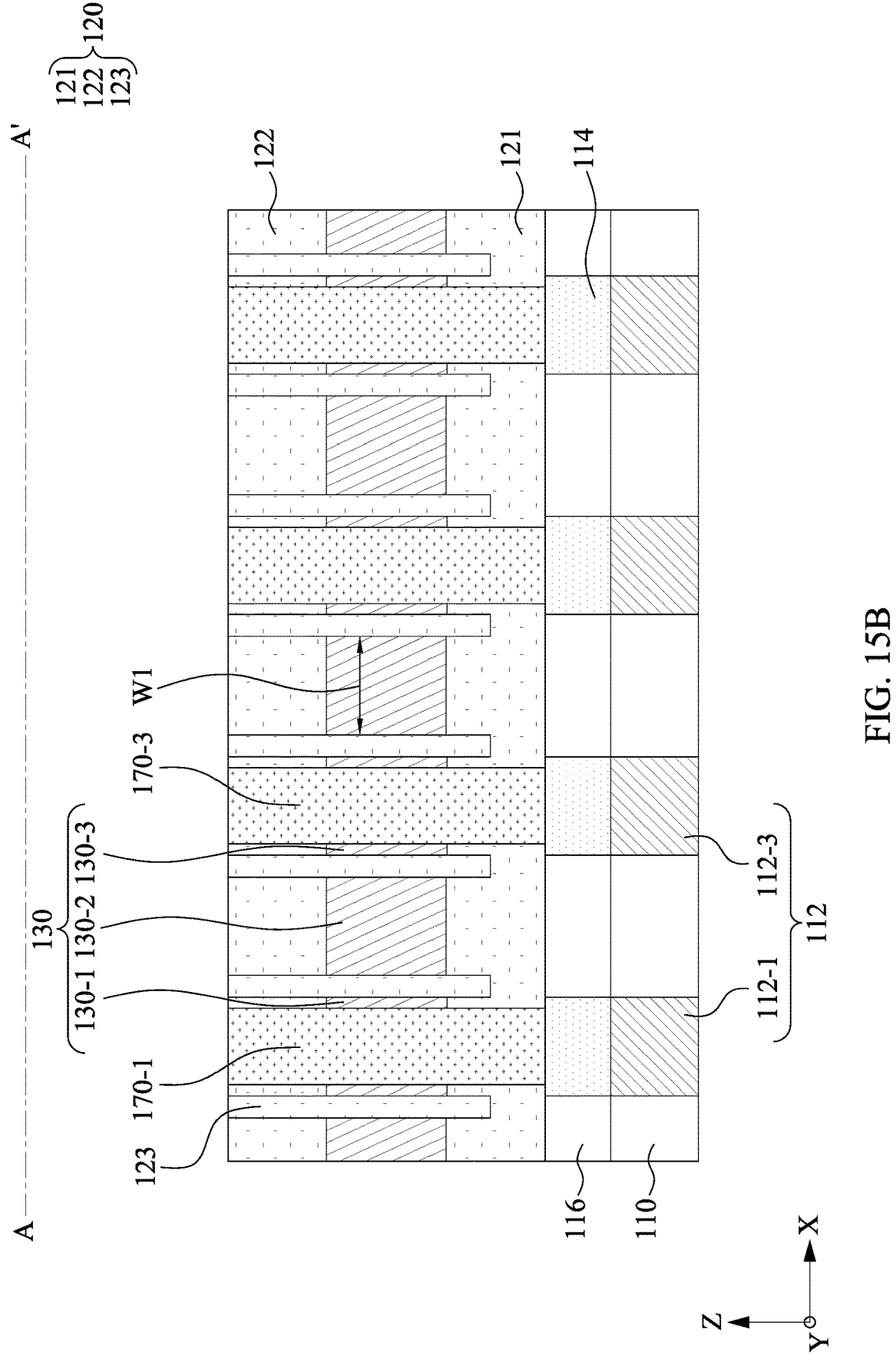
FIG. 15B is a cross-section along line A-A' of FIG. 15A, in accordance with some embodiments of the present disclosure.

Referring to FIG. 15A and FIG. 15B, an isolation layer 123 may be formed. In some embodiments, the isolation layer 123 may be formed within the recess 192p, thereby produces a dielectric structure 120. The material of the isolation 123 may be the same as that of the dielectric layer 121.

Figure 16A:
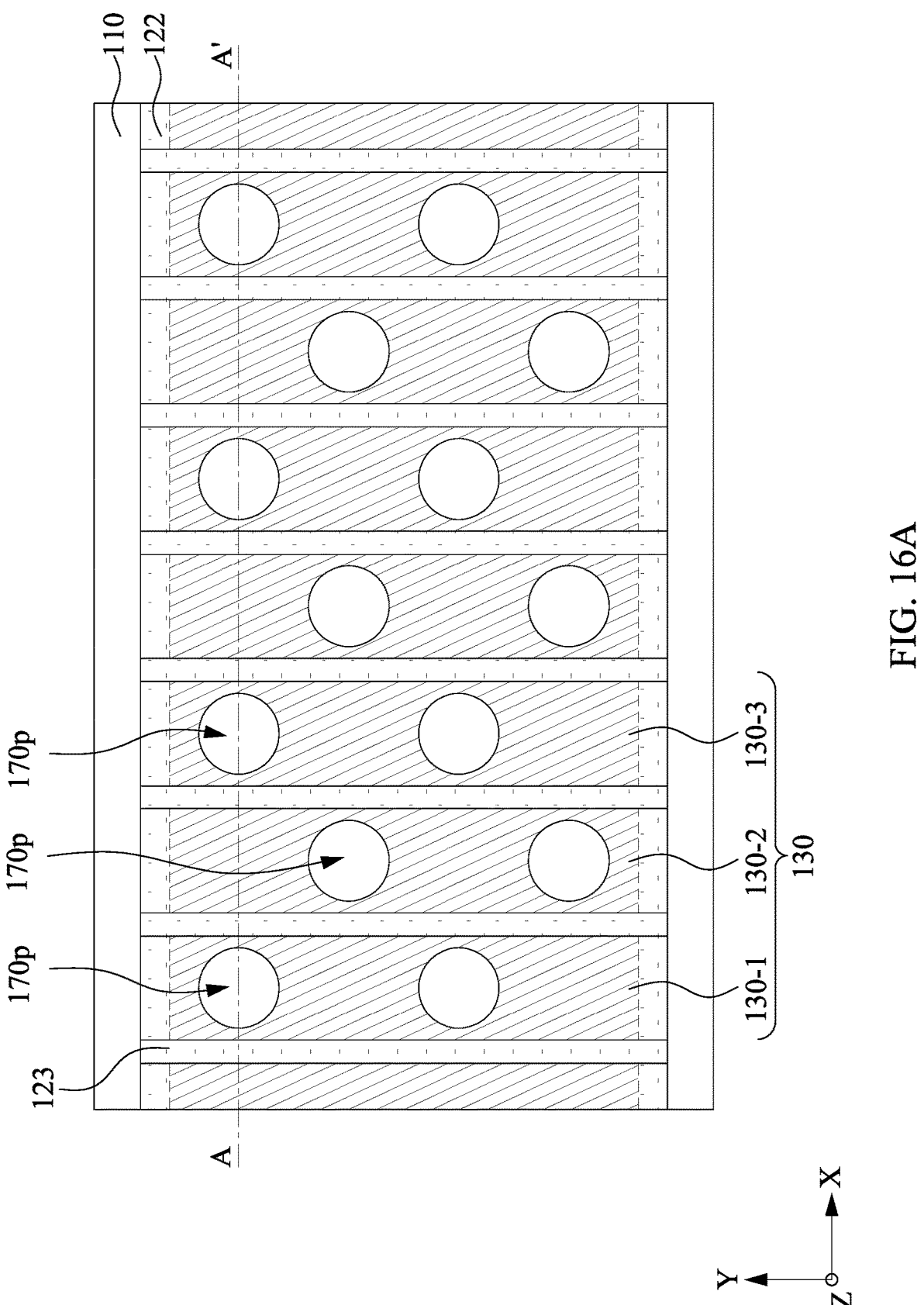
FIG. 16A illustrates one or more stages of an exemplary method for manufacturing a semiconductor device according to some embodiments of the present disclosure.
Figure 16B:
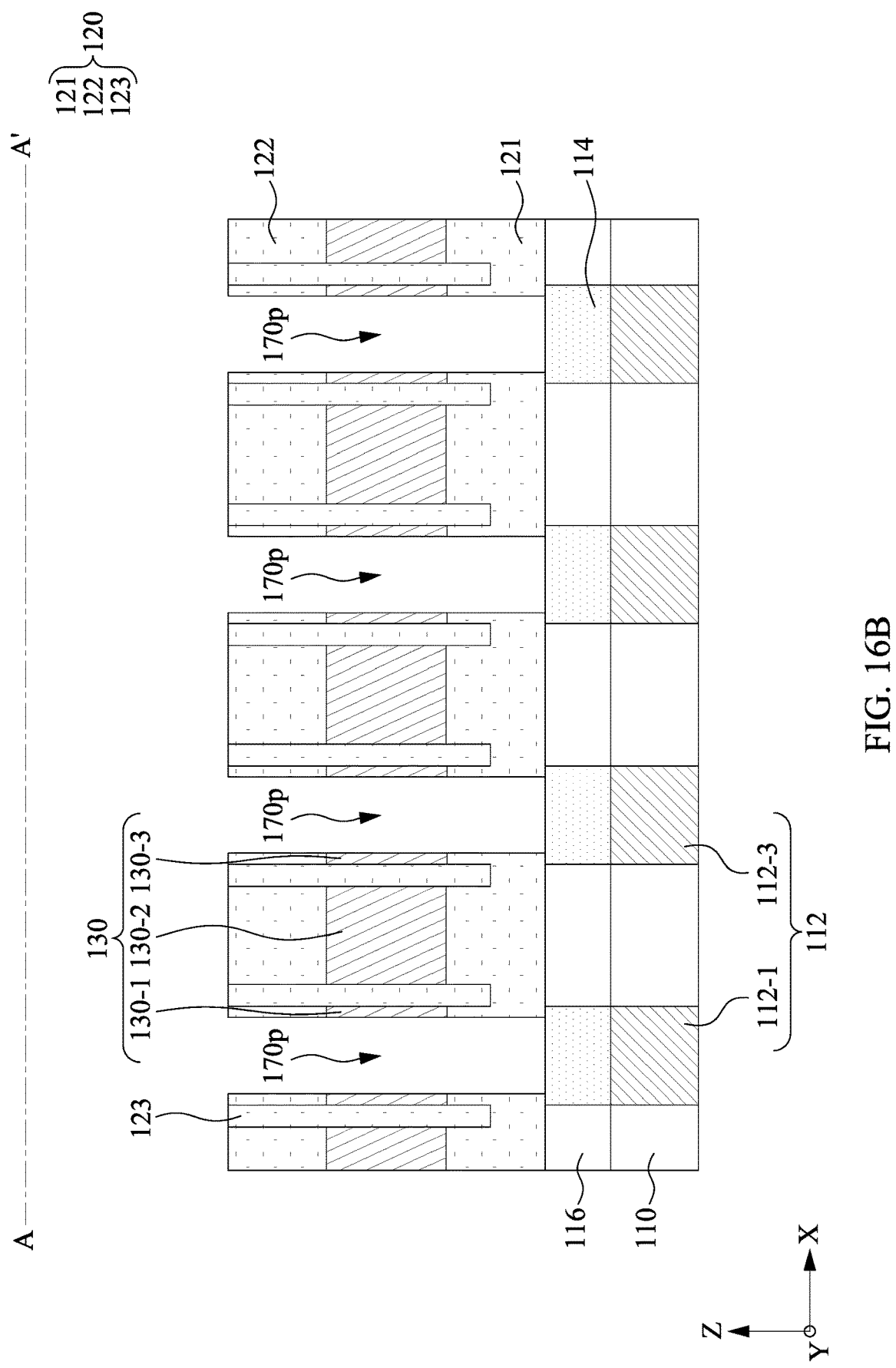
FIG. 16B is a cross-section along line A-A' of FIG. 16A, in accordance with some embodiments of the present disclosure.

Referring to FIG. 16A and FIG. 16B, openings 170p may be formed. In some embodiments, the sacrificial layers 170-1, 170-2, and 170-3 may be removed to form the openings 170p. In some embodiments, the opening 170p may penetrate the dielectric structure 120 and the word line 130.

Figure 17A:
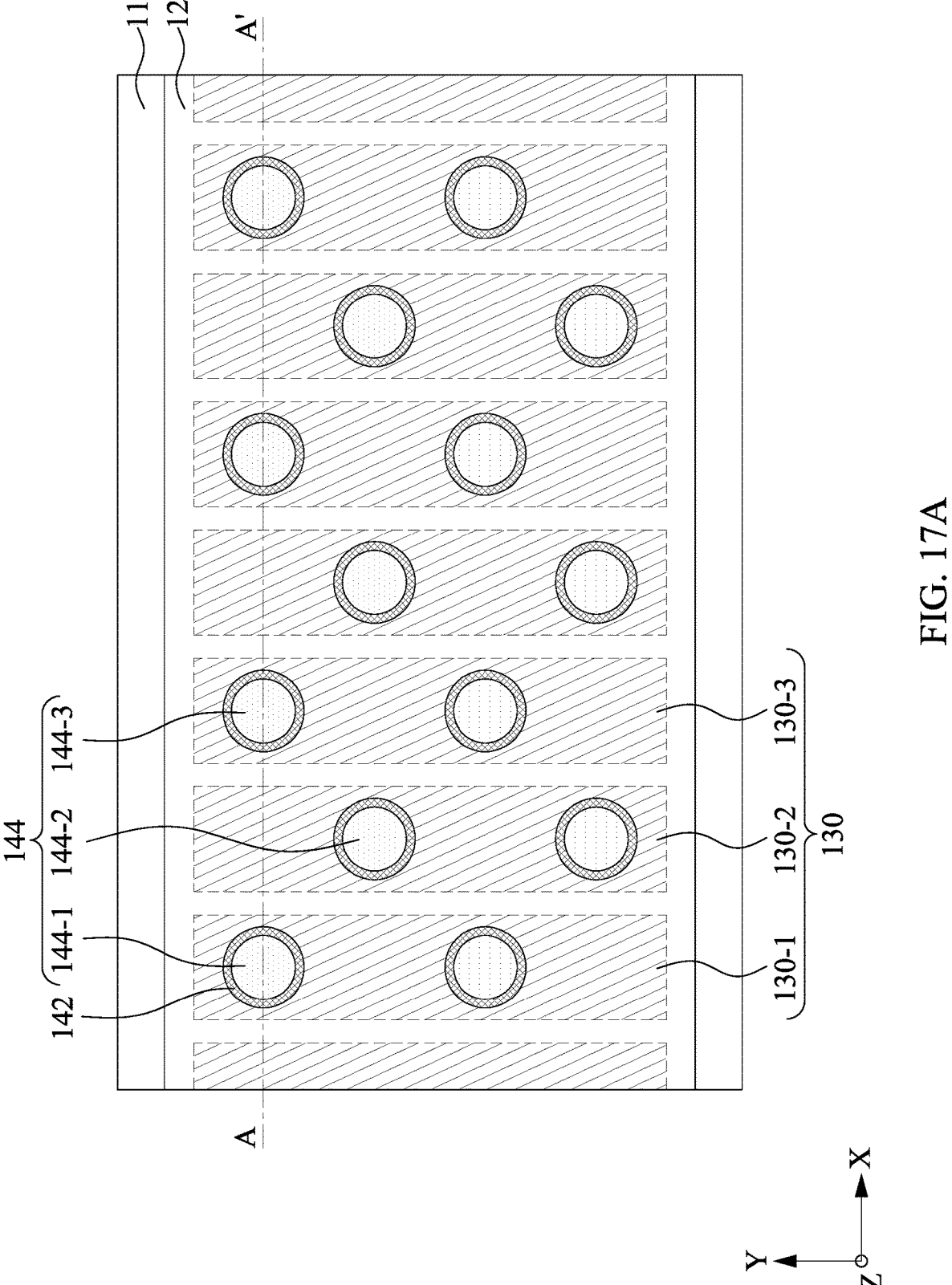
FIG. 17A illustrates one or more stages of an exemplary method for manufacturing a semiconductor device according to some embodiments of the present disclosure.
Figure 17B:
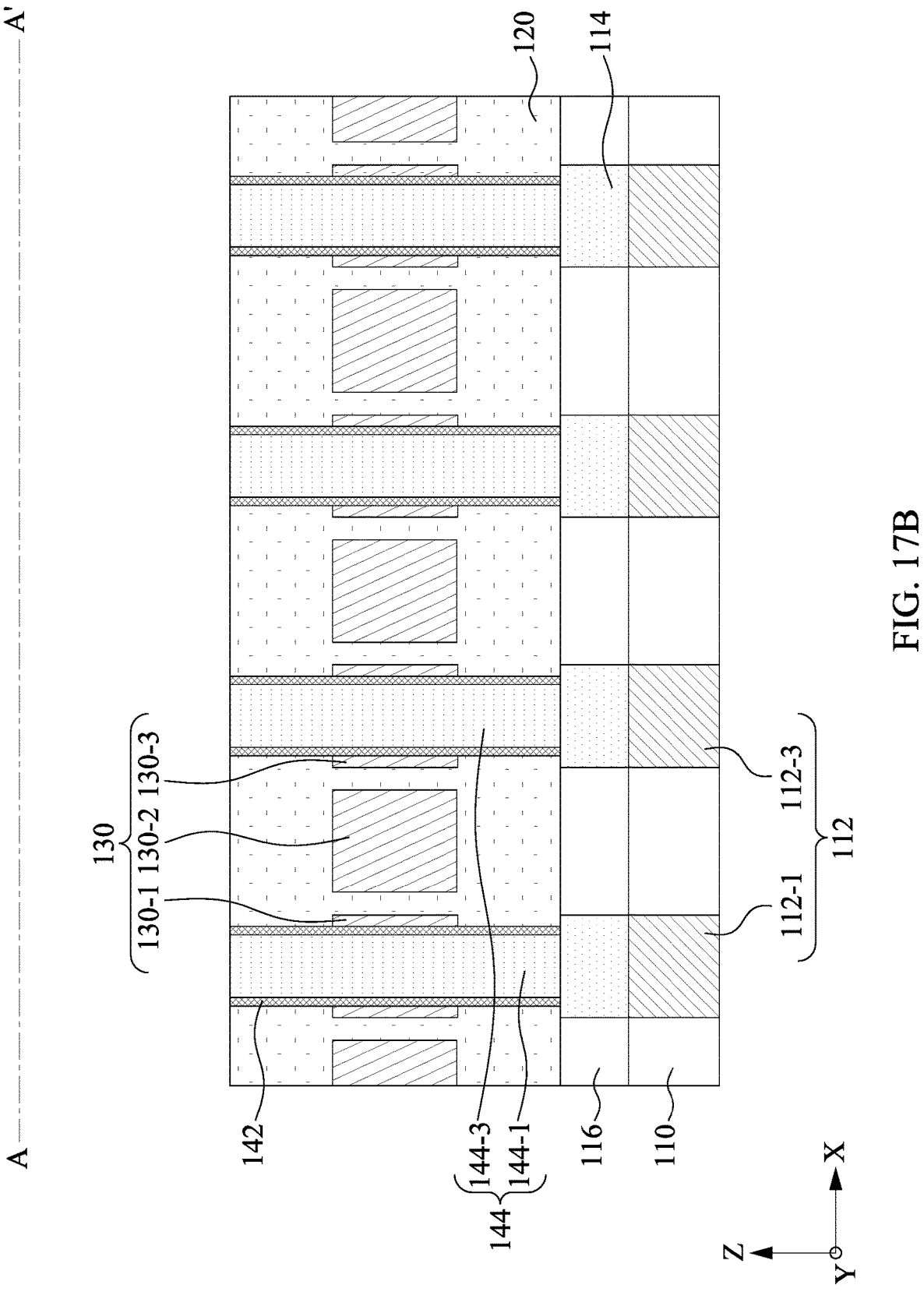
FIG. 17B is a cross-section along line A-A' of FIG. 17A, in accordance with some embodiments of the present disclosure.

Referring to FIG. 17A and FIG. 17B, gate dielectric layers 142 and channel layers 144 (e.g., 144-1, 144-2, and 144-3) may be formed. In some embodiments, the gate dielectric layer 142 may be formed within the openings 170p. In some embodiments, the channel layers 144-1, 144-2, and 144-3 may be formed within the openings 170p and surrounded by the gate dielectric layer 142. The gate dielectric layer 142 may be formed by, for example, CVD, ALD, PVD, LPCVD, PECVD, or other suitable processes. The channel layers 144 may be formed by, for example, CVD, ALD, PVD, LPCVD, PECVD, or other suitable processes.

Figure 18A:
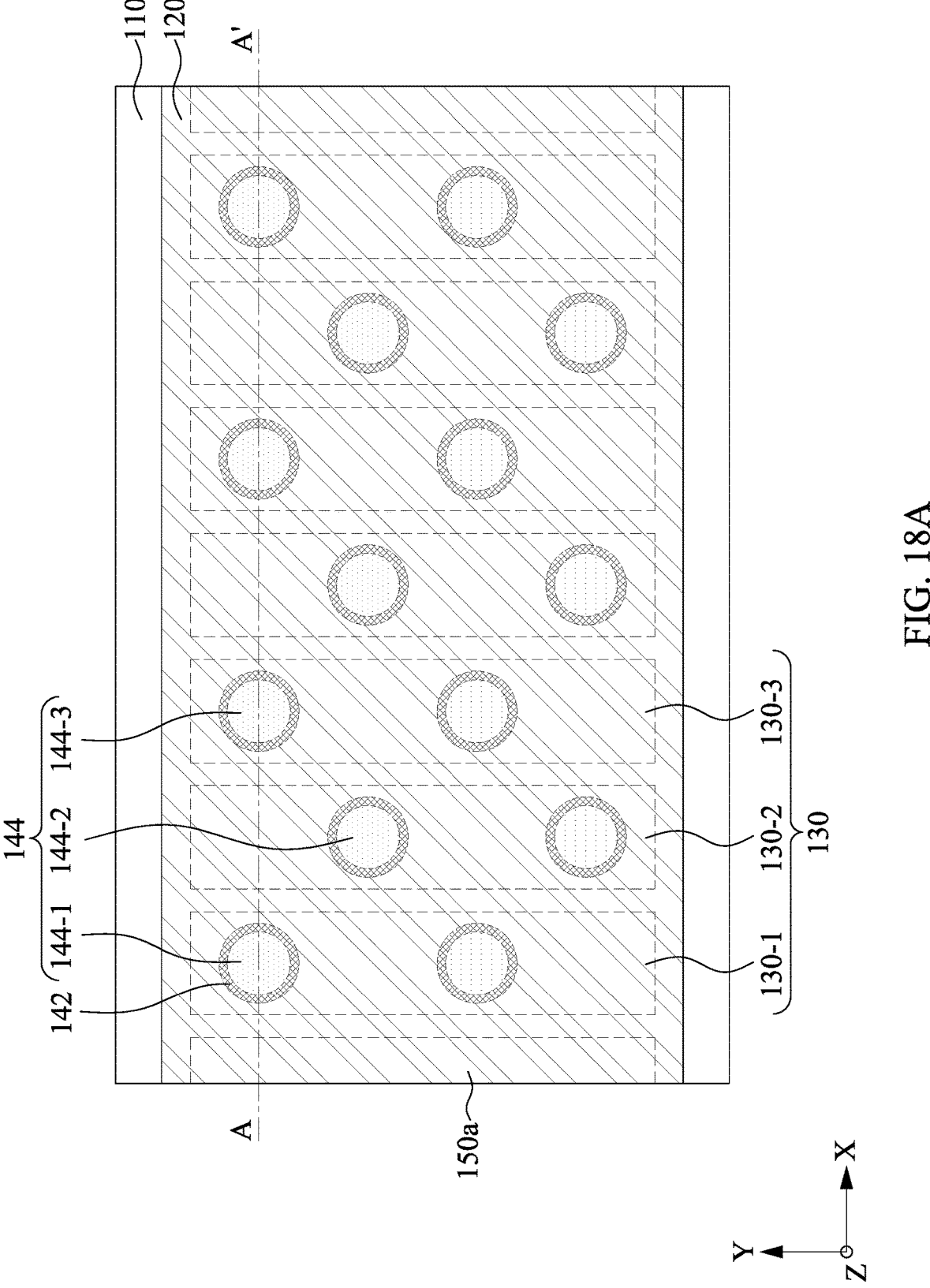
FIG. 18A illustrates one or more stages of an exemplary method for manufacturing a semiconductor device according to some embodiments of the present disclosure.
Figure 18B:
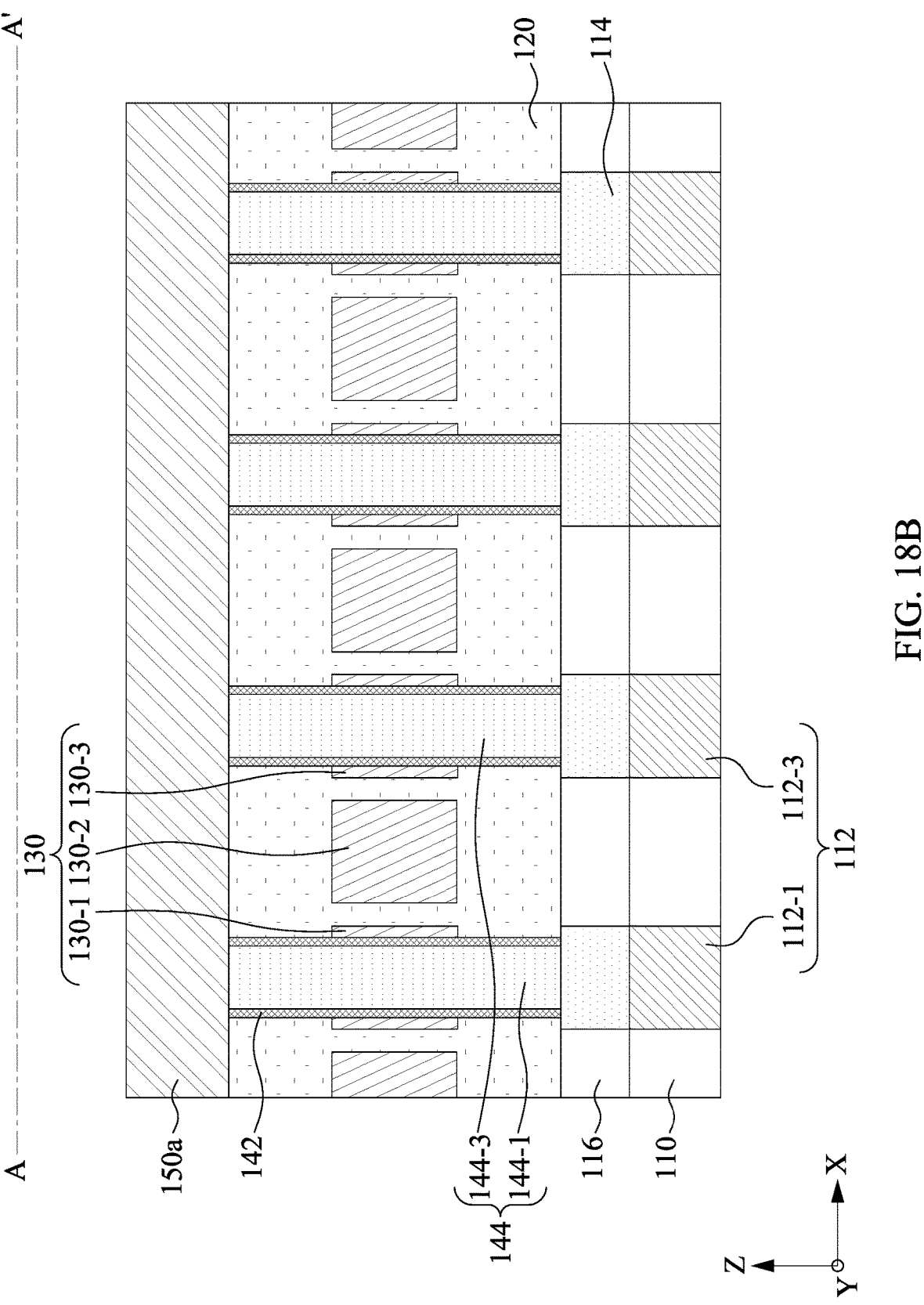
FIG. 18B is a cross-section along line A-A' of FIG. 18A, in accordance with some embodiments of the present disclosure.

Referring to FIG. 18A and FIG. 18B, a metallization layer 150a may be formed to cover the channel layers 144, the gate dielectric layers 142, and the word lines 130. The metallization layer 150a may be formed by, for example, CVD, ALD, PVD, LPCVD, PECVD, or other suitable processes.

Figure 19A:
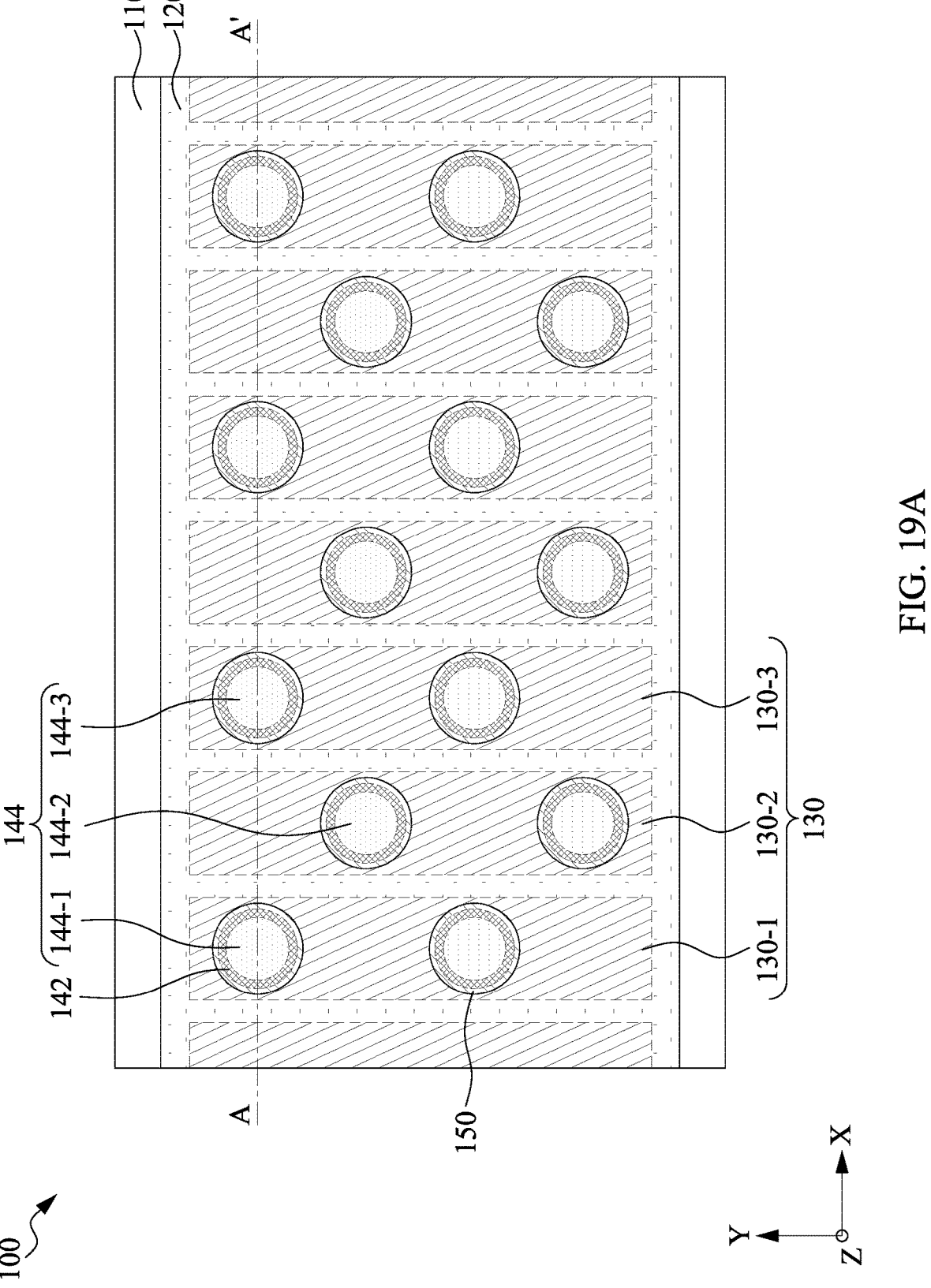
FIG. 19A illustrates one or more stages of an exemplary method for manufacturing a semiconductor device according to some embodiments of the present disclosure.
Figure 19B:
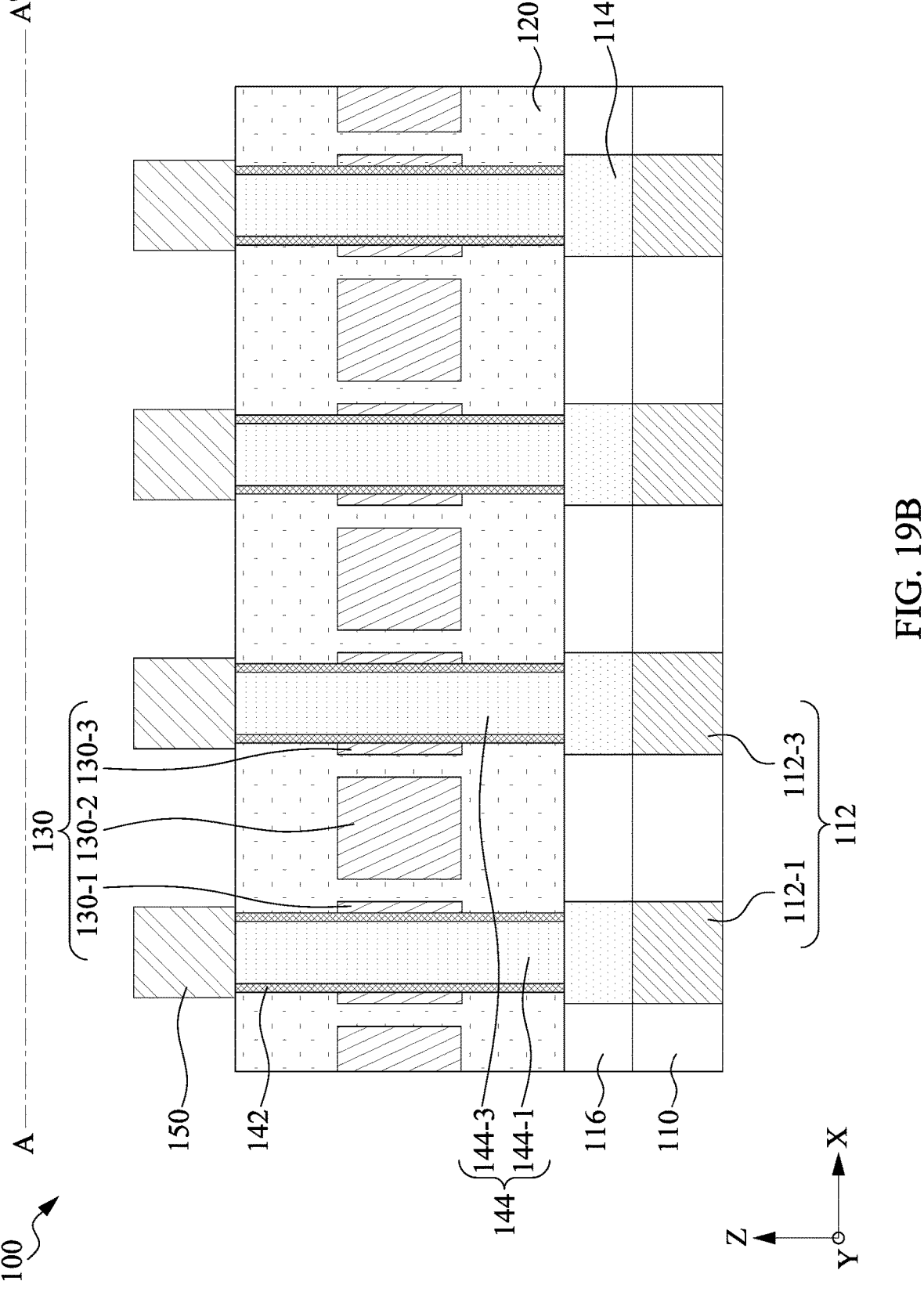
FIG. 19B is a cross-section along line A-A' of FIG. 19A, in accordance with some embodiments of the present disclosure.

Referring to FIG. 19A and FIG. 19B, landing pads 150 may be formed. In some embodiments, the metallization layer 150a may be patterned. The metallization layer 150a over the channel layers 144 may remain to form the landing pads 150, which thereby produce the semiconductor device 100. The landing pad 150 may formed over the channel layer 144. The landing pad 150 may be configured to connect the channel layer 144 and a bit line (not shown).

In this embodiment, the pattern of the word line 130 may be determined by the width controlling structure 190*b*. The word line 130 may be formed without using a photolithography process, which may cause overlay error and then result in electrical leakage between the channel layer 144 and the word line 130. Further, the width of the word line 130 may be controlled accurately by determining the thickness of the width controlling structure 190*b*. Thus, the performance of the semiconductor device 100 may be improved.

One aspect of the present disclosure provides a method of manufacturing a semiconductor device. The method includes: providing a substrate; forming a metallization layer on the substrate; forming a first sacrificial layer and a second sacrificial layer, each of which penetrates the metallization layer; forming a first mask layer and a second mask layer, wherein the first mask layer covers the first sacrificial layer, the second mask layer covers the second sacrificial layer; forming a first width controlling element on a lateral surface of the first mask layer and a second width controlling element on a lateral surface of the second mask layer; removing the first mask layer and the second mask layer; and patterning the metallization layer to form a first word line between the first sacrificial layer and the second sacrificial layer, wherein a dimension of the first word line depends on a dimension of the first width controlling element.

Another aspect of the present disclosure provides a method of manufacturing a semiconductor device. The method includes: providing a substrate; forming a metallization layer on the substrate; forming a first sacrificial layer, a second sacrificial layer, and a third sacrificial layer penetrating the metallization layer, wherein the first sacrificial layer is aligned to the third sacrificial layer along a first direction, and the second sacrificial layer is free from overlapping the first sacrificial layer and the third sacrificial layer along the first direction; forming a width controlling structure between the first sacrificial layer and the third sacrificial layer, wherein the width controlling structure exposes the first sacrificial layer, the second sacrificial layer, and the third sacrificial layer; forming a protective layer covering the first sacrificial layer, the second sacrificial layer, the third sacrificial layer; and removing the width controlling structure; and patterning the metallization layer to form a first word line surrounding the first sacrificial layer, a second word line surrounding the second sacrificial layer, and a third word line surrounding the third sacrificial layer.

Another aspect of the present disclosure provides a method for manufacturing a semiconductor device. The method includes: providing a substrate; forming a metallization layer on the substrate; forming a mask pattern on the metallization layer; forming a width controlling structure on a lateral surface of the mask pattern to define a gap exposing the metallization layer; removing the mask pattern; and patterning the metallization layer to form a word line, wherein a width of the word line is substantially equal to a width of the gap.

The embodiments of the present disclosure provide a method of manufacturing a semiconductor device. In this embodiment, the pattern of the word line may be determined by a width controlling structure. Further, the word line may be formed without using a photolithography process, which may cause overlay error and then result in electrical leakage between a channel layer and the word line. Further, the dimension (e.g., width) of the word line may be controlled accurately by determining the thickness of the width controlling structure. Thus, the performance of the semiconductor device may be improved.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   providing a substrate;
   forming a metallization layer on the substrate;
   forming a mask pattern on the metallization layer;
   forming a width controlling structure on a lateral surface of the mask pattern to define a gap exposing the metallization layer;
   removing the mask pattern;
   patterning the metallization layer to form a word line;
   forming a protection layer after removing the mask pattern, wherein the protection layer fills in the gap defined by the width controlling structure; and
   removing the width controlling structure after forming the protection layer,
   wherein a width of the word line is substantially equal to a width of the gap.

2. The method of claim 1, wherein the mask pattern comprises a first mask element and a second mask element over the first mask element, and a material of the first mask element is different from that of the second mask element.

3. The method of claim 1, wherein the width controlling structure is removed before patterning the metallization layer.

4. The method of claim 1, wherein a pitch of the mask pattern is greater than a pitch of the word line.

5. The method of claim 1, wherein patterning the metallization layer comprises:
   removing the metallization layer exposed by the protection layer.

6. The method of claim 1, further comprising:
   forming a sacrificial layer penetrating the metallization layer;
   removing sacrificial layer after forming the word line to form an opening; and
   forming a channel layer within the opening.

* * * * *